(12) United States Patent
Wang et al.

(10) Patent No.: US 11,322,394 B2
(45) Date of Patent: May 3, 2022

(54) CONTACT FORMATION METHOD AND RELATED STRUCTURE

(71) Applicant: Taiwan Semiconductor Manufacturing Co., Ltd., Hsinchu (TW)

(72) Inventors: Chao-Hsun Wang, Taoyuan County (TW); Wang-Jung Hsueh, New Taipei (TW); Kuo-Yi Chao, Hsinchu (TW); Mei-Yun Wang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 24 days.

(21) Appl. No.: 16/751,136

(22) Filed: Jan. 23, 2020

(65) Prior Publication Data

US 2020/0161173 A1 May 21, 2020

Related U.S. Application Data

(62) Division of application No. 15/884,012, filed on Jan. 30, 2018, now Pat. No. 10,636,697.

(Continued)

(51) Int. Cl.
*H01L 21/768* (2006.01)
*H01L 29/423* (2006.01)
(Continued)

(52) U.S. Cl.
CPC .. *H01L 21/76807* (2013.01); *H01L 21/31055* (2013.01); *H01L 21/3212* (2013.01); *H01L 21/76877* (2013.01); *H01L 21/823468* (2013.01); *H01L 29/0847* (2013.01); *H01L 29/41775* (2013.01); *H01L 29/4232* (2013.01);
(Continued)

(58) Field of Classification Search
None
See application file for complete search history.

(56) References Cited

U.S. PATENT DOCUMENTS 6,326,251 B1 * 12/2001 Gardner ............ H01L 21/28079
257/E21.202
6,339,029 B1    1/2002 Yu et al.
(Continued)

FOREIGN PATENT DOCUMENTS

JP    2010171291    8/2010
KR    20170080444   7/2017

*Primary Examiner* — Long Pham
(74) *Attorney, Agent, or Firm* — Haynes and Boone, LLP

(57) ABSTRACT

A method and structure for forming a via-first metal gate contact includes depositing a first dielectric layer over a substrate having a gate structure with a metal gate layer. An opening is formed within the first dielectric layer to expose a portion of the substrate, and a first metal layer is deposited within the opening. A second dielectric layer is deposited over the first dielectric layer and over the first metal layer. The first and second dielectric layers are etched to form a gate via opening. The gate via opening exposes the metal gate layer. A portion of the second dielectric layer is removed to form a contact opening that exposes the first metal layer. The gate via and contact openings merge to form a composite opening. A second metal layer is deposited within the composite opening, thus connecting the metal gate layer to the first metal layer.

20 Claims, 15 Drawing Sheets

Related U.S. Application Data

(60) Provisional application No. 62/592,763, filed on Nov. 30, 2017.

(51) Int. Cl.

| | | |
|---|---|---|
| *H01L 21/321* | (2006.01) | |
| *H01L 21/8234* | (2006.01) | |
| *H01L 21/3105* | (2006.01) | |
| *H01L 29/417* | (2006.01) | |
| *H01L 29/08* | (2006.01) | |
| *H01L 29/49* | (2006.01) | |

(52) U.S. Cl.
CPC .. *H01L 29/4966* (2013.01); *H01L 21/823475* (2013.01)

(56) References Cited

U.S. PATENT DOCUMENTS

| | | |
|---|---|---|
| 6,440,847 B1 | 8/2002 | Lou et al. |
| 6,940,108 B2 | 9/2005 | Cheng et al. |
| 8,446,012 B2 | 5/2013 | Yu et al. |
| 9,379,119 B1 | 6/2016 | Huang et al. |
| 9,431,297 B2 | 8/2016 | Wu et al. |
| 2009/0014796 A1 | 1/2009 | Liaw |
| 2010/0308380 A1 | 12/2010 | Rothwell et al. |
| 2015/0270176 A1 | 9/2015 | Xie et al. |
| 2015/0311082 A1 | 10/2015 | Bouche et al. |
| 2016/0133623 A1* | 5/2016 | Xie ............... H01L 29/66545 257/384 |
| 2016/0133626 A1 | 5/2016 | Xie et al. |
| 2016/0379925 A1 | 12/2016 | Ok et al. |
| 2017/0080444 A1 | 3/2017 | Posselius et al. |
| 2017/0194211 A1 | 7/2017 | Lai et al. |
| 2017/0221891 A1 | 8/2017 | Chen et al. |
| 2018/0116052 A1 | 4/2018 | Mass et al. |

\* cited by examiner

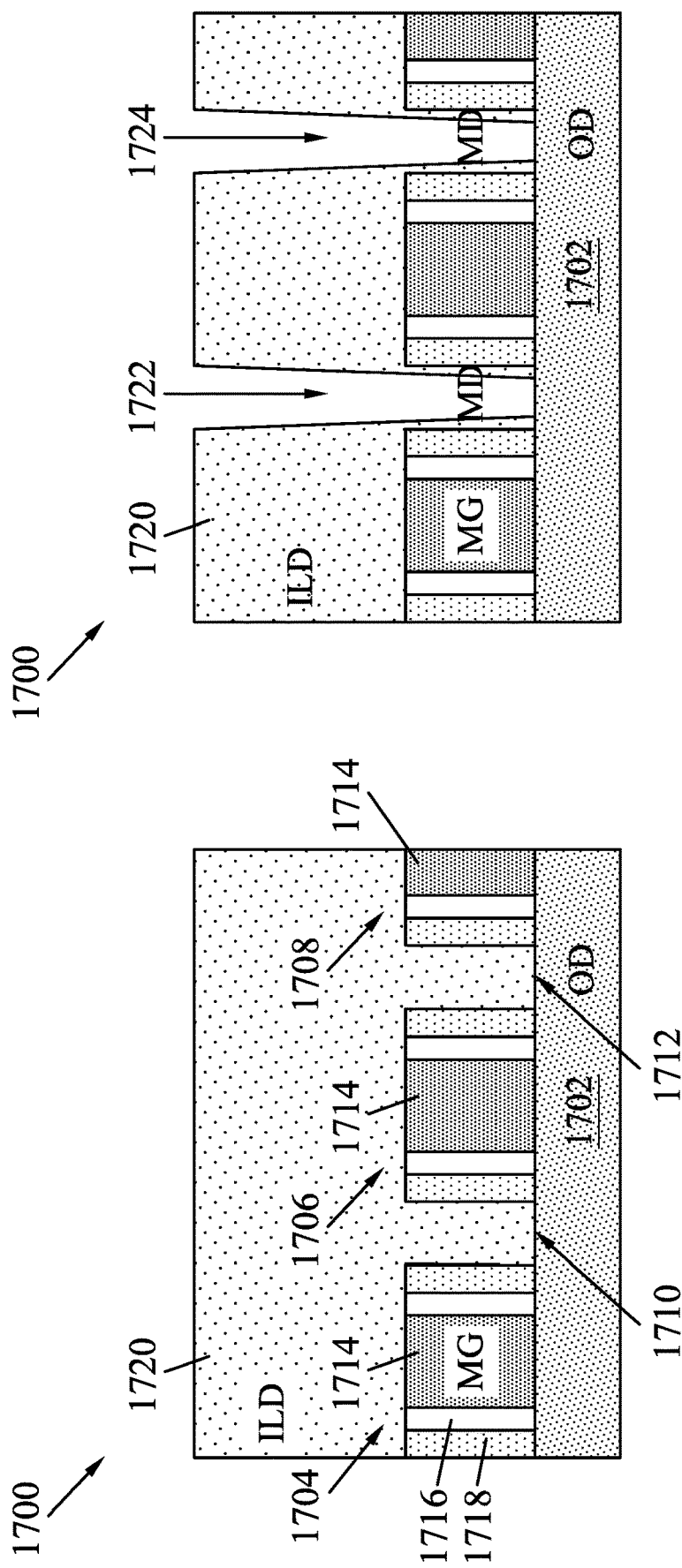

CONTACT FORMATION METHOD AND RELATED STRUCTURE

CROSS-REFERENCE TO RELATED APPLICATION

This application is a divisional of U.S. patent application Ser. No. 15/884,012, filed Jan. 30, 2018, which claims the benefit of U.S. Provisional Application No. 62/592,763, filed Nov. 30, 2017, the entireties of which are incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, forming a reliable contact to a metal gate layer, and between the metal gate layer and an adjacent source, drain, and/or body region, requires a high degree of overlay control (e.g., pattern-to-pattern alignment) and a sufficiently large process window. However, with the continued scaling of IC dimensions, coupled with new patterning techniques (e.g., such as double patterning), accurate overlay control is more critical than ever. Moreover, process windows for aggressively scaled ICs are becoming quite narrow, which can lead to device degradation and/or failure. For at least some conventional processes, the process window of semiconductor fabrication processes used to form such contacts to the metal gate layer, and between the metal gate layer and an adjacent source, drain, and/or body region, has become too narrow and can no longer satisfy process window requirements.

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 17-23 provide cross-sectional views of a device at intermediate stages of fabrication and processed in accordance with the method of FIG. 16.

DETAILED DESCRIPTION

Figure 1A:
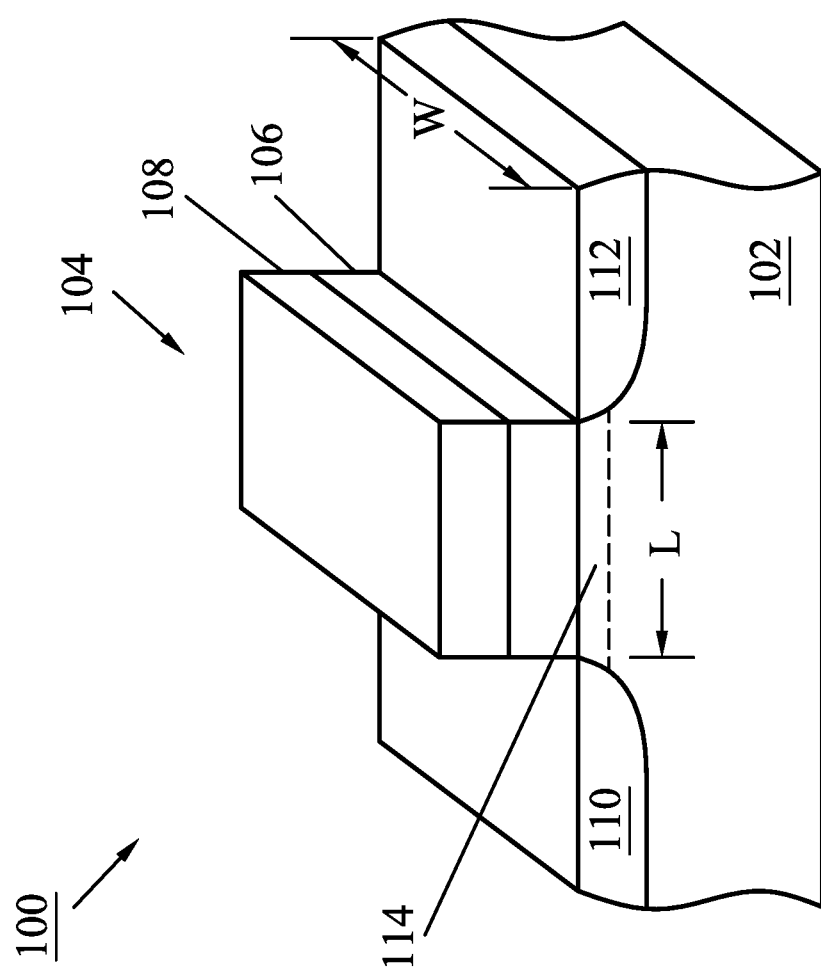
FIG. 1A is a cross-sectional view of an MOS transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of a via-first metal gate contact which may be employed in any of a variety of device types. For example, embodiments of the present disclosure may be used to form via-first metal gate contacts in planar bulk metal-oxide-semiconductor field-effect transistors (MOSFETs), multi-gate transistors (planar or vertical) such as FinFET devices, gate-all-around (GAA) devices, Omega-gate (Q-gate) devices, or Pi-gate (Π-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of P-type and/or N-type devices. One of ordinary skill may recognize other embodiments of semiconductor devices that may benefit from aspects of the present disclosure.

With reference to the example of FIG. 1A, illustrated therein is an MOS transistor 100, providing an example of merely one device type which may include embodiments of the present disclosure. It is understood that the exemplary transistor 100 is not meant to be limiting in any way, and those of skill in the art will recognize that embodiments of the present disclosure may be equally applicable to any of a variety of other device types, such as those described above. The transistor 100 is fabricated on a substrate 102 and includes a gate stack 104. The substrate 102 may be a semiconductor substrate such as a silicon substrate. The substrate 102 may include various layers, including conductive or insulating layers formed on the substrate 102. The substrate 102 may include various doping configurations depending on design requirements as is known in the art. The substrate 102 may also include other semiconductors such as germanium, silicon carbide (SiC), silicon germanium (SiGe), or diamond. Alternatively, the substrate 102 may include a compound semiconductor and/or an alloy semiconductor. Further, in some embodiments, the substrate 102 may include an epitaxial layer (epi-layer), the substrate 102 may be strained for performance enhancement, the substrate 102 may include a silicon-on-insulator (SOI) structure, and/or the substrate 102 may have other suitable enhancement features.

The gate stack 104 includes a gate dielectric 106 and a gate electrode 108 disposed on the gate dielectric 130. In some embodiments, the gate dielectric 106 may include an interfacial layer such as silicon oxide layer ($SiO_2$) or silicon oxynitride (SiON), where such interfacial layer may be formed by chemical oxidation, thermal oxidation, atomic layer deposition (ALD), chemical vapor deposition (CVD), and/or other suitable method. In some examples, the gate dielectric 106 includes a high-k dielectric layer such as hafnium oxide ($HfO_2$). Alternatively, the high-k dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 106 may include silicon dioxide or other suitable dielectric. The gate dielectric 106 may be formed by ALD, physical vapor deposition (PVD), CVD, oxidation, and/or other suitable methods. In some embodiments, the gate electrode 108 may be deposited as part of a gate first or gate last (e.g., replacement gate) process. In various embodiments, the gate electrode 108 includes a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 108 may include a first metal material for an N-type transistor and a second metal material for a P-type transistor. Thus, the transistor 100 may include a dual work-function metal gate configuration. For example, the first metal material (e.g., for N-type devices) may include metals having a work function substantially aligned with a work function of the substrate conduction band, or at least substantially aligned with a work function of the conduction band of a channel region 114 of the transistor 100. Similarly, the second metal material (e.g., for P-type devices) may include metals having a work function substantially aligned with a work function of the substrate valence band, or at least substantially aligned with a work function of the valence band of the channel region 114 of the transistor 100. Thus, the gate electrode 104 may provide a gate electrode for the transistor 100, including both N-type and P-type devices. In some embodiments, the gate electrode 108 may alternately or additionally include a polysilicon layer. In various examples, the gate electrode 108 may be formed using PVD, CVD, electron beam (e-beam) evaporation, and/or other suitable process. In some embodiments, sidewall spacers are formed on sidewalls of the gate stack 104. Such sidewall spacers may include a dielectric material such as silicon oxide, silicon nitride, silicon carbide, silicon oxynitride, or combinations thereof.

The transistor 100 further includes a source region 110 and a drain region 112 each formed within the semiconductor substrate 102, adjacent to and on either side of the gate stack 104. In some embodiments, the source and drain regions 110, 112 include diffused source/drain regions, ion implanted source/drain regions, epitaxially grown regions, or a combination thereof. The channel region 114 of the transistor 100 is defined as the region between the source and drain regions 110, 112 under the gate dielectric 106, and within the semiconductor substrate 102. The channel region 114 has an associated channel length "L" and an associated channel width "W". When a bias voltage greater than a threshold voltage ($V_t$) (i.e., turn-on voltage) for the transistor 100 is applied to the gate electrode 108 along with a concurrently applied bias voltage between the source and drain regions 110, 112, an electric current (e.g., a transistor drive current) flows between the source and drain regions 110, 112 through the channel region 114. The amount of drive current developed for a given bias voltage (e.g., applied to the gate electrode 108 or between the source and drain regions 110, 112) is a function of, among others, the mobility of the material used to form the channel region 114. In some examples, the channel region 114 includes silicon (Si) and/or a high-mobility material such as germanium, which may be epitaxially grown, as well as any of the plurality of compound semiconductors or alloy semiconductors as known in the art. High-mobility materials include those materials with electron and/or hole mobility greater than silicon (Si), which has an intrinsic electron mobility at room temperature (300 K) of around 1350 $cm^2$/V-s and an intrinsic hole mobility at room temperature (300 K) of around 480 $cm^2$/V-s.

Figure 1B:
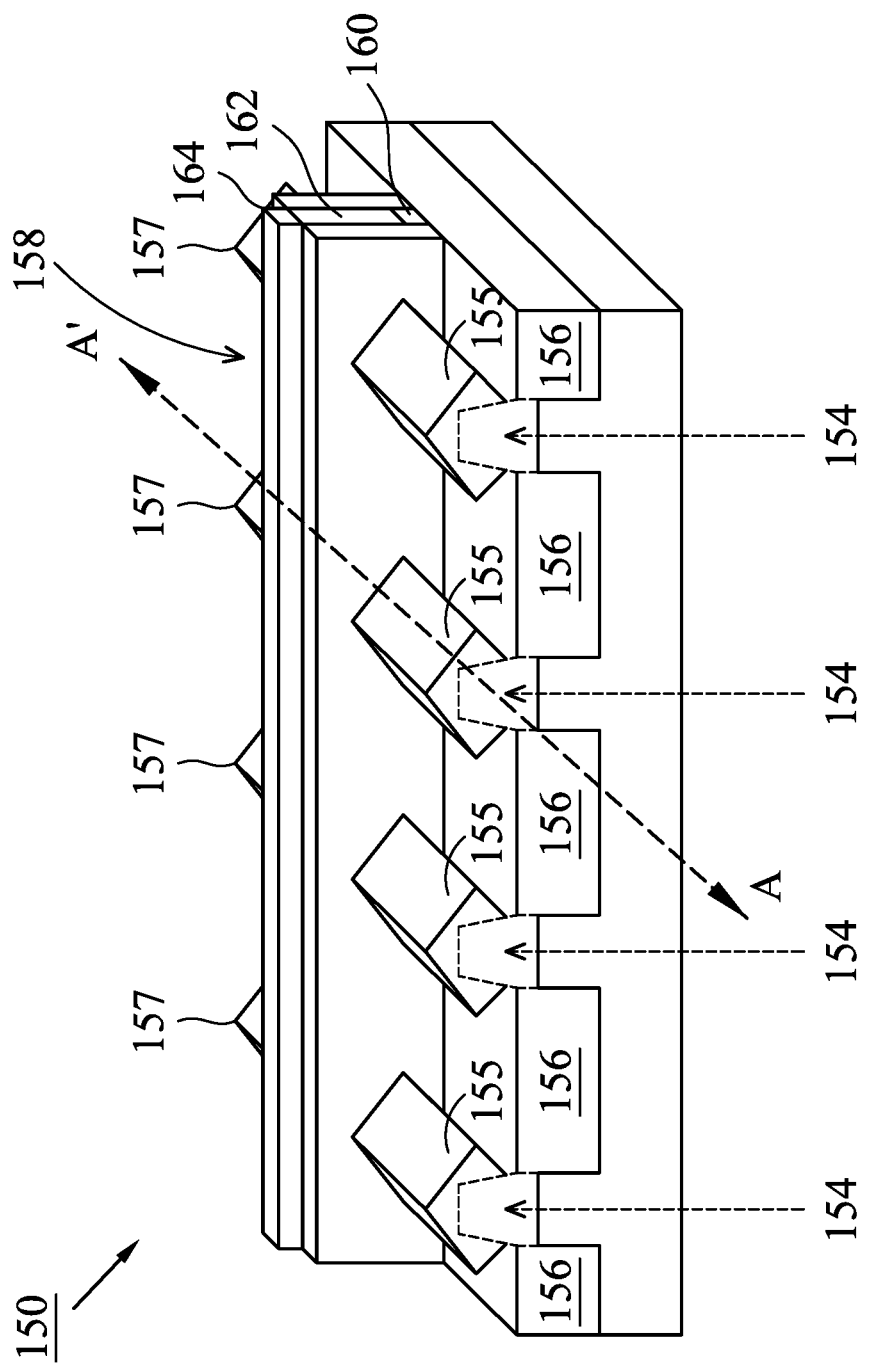
FIG. 1B is perspective view of an embodiment of a FinFET device according to one or more aspects of the present disclosure.

Referring to FIG. 1B, illustrated therein is a FinFET device 150, providing an example of an alternative device type which may include embodiments of the present disclosure. By way of example, the FinFET device 150 includes one or more fin-based, multi-gate field-effect transistors (FETs). The FinFET device 150 includes a substrate 152, at least one fin element 154 extending from the substrate 152, isolation regions 156, and a gate structure 158 disposed on and around the fin-element 154. The substrate 152 may be a semiconductor substrate such as a silicon substrate. In various embodiments, the substrate 152 may be substantially the same as the substrate 102 and may include one or more of the materials used for the substrate 102, as described above.

The fin-element 154, like the substrate 152, may include one or more epitaxially-grown layers, and may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 154 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin 154. The recesses may be etched using a dry etch (e.g., chemical oxide removal), a wet etch, and/or other suitable processes. Numerous other embodiments of methods to form the fins 154 on the substrate 152 may also be used.

Each of the plurality of fins 154 also include a source region 155 and a drain region 157 where the source/drain regions 155, 157 are formed in, on, and/or surrounding the fin 154. The source/drain regions 155, 157 may be epitaxially grown over the fins 154. In addition, a channel region of a transistor is disposed within the fin 154, underlying the gate structure 158, along a plane substantially parallel to a plane defined by section AA' of FIG. 1B. In some examples, the channel region of the fin includes a high-mobility material, as described above.

The isolation regions 156 may be shallow trench isolation (STI) features. Alternatively, a field oxide, a LOCOS feature, and/or other suitable isolation features may be implemented on and/or within the substrate 152. The isolation regions 156 may be composed of silicon oxide, silicon nitride, silicon oxynitride, fluorine-doped silicate glass (FSG), a low-k dielectric, combinations thereof, and/or other suitable material known in the art. In an embodiment, the isolation regions 156 are STI features and are formed by etching trenches in the substrate 152. The trenches may then be filled with isolating material, followed by a chemical mechanical polishing (CMP) process. However, other embodiments are possible. In some embodiments, the isolation regions 156 may include a multi-layer structure, for example, having one or more liner layers.

The gate structure 158 includes a gate stack having an interfacial layer 160 formed over the channel region of the fin 154, a gate dielectric layer 162 formed over the interfacial layer 160, and a metal layer 164 formed over the gate dielectric layer 162. In various embodiments, the interfacial layer 160 is substantially the same as the interfacial layer described as part of the gate dielectric 106. In some embodiments, the gate dielectric layer 162 is substantially the same as the gate dielectric 106 and may include high-k dielectrics similar to that used for the gate dielectric 106. Similarly, in various embodiments, the metal layer 164 is substantially the same as the gate electrode 108, described above. In some embodiments, sidewall spacers are formed on sidewalls of the gate structure 158. The sidewall spacers may include a dielectric material such as silicon oxide, silicon nitride, silicon carbide, silicon oxynitride, or combinations thereof.

As discussed above, each of the transistor 100 and FinFET device 150 may include one or more via-first metal gate contacts, embodiments of which are described in more detail below. In some examples, the via-first metal gate contacts described herein may be part of a local interconnect structure. As used herein, the term "local interconnect" is used to describe the lowest level of metal interconnects and are differentiated from intermediate and/or global interconnects. Local interconnects span relatively short distances and are sometimes used, for example, to electrically connect a source, drain, body, and/or gate of a given device, or those of nearby devices. Additionally, local interconnects may be used to facilitate a vertical connection of one or more devices to an overlying metallization layer (e.g., to an intermediate interconnect layer), for example, through one or more vias. Interconnects (e.g., including local, intermediate, or global interconnects), in general, may be formed as part of back-end-of-line (BEOL) fabrication processes and include a multi-level network of metal wiring. Moreover, any of a plurality of IC circuits and/or devices (e.g., such as the transistor 100 or FinFET 150) may be connected by such interconnects.

With the aggressive scaling and ever-increasing complexity of advanced IC devices and circuits, contact and local interconnect design has proved to be a difficult challenge. For example, forming a reliable contact to a metal gate layer, and between the metal gate layer and an adjacent source, drain, and/or body region, requires a high degree of overlay control (e.g., pattern-to-pattern alignment) and a sufficiently large process window. As used herein, the term "process window" is used to define a particular focus and exposure (intensity) which provides for a final image patterned into a resist layer (e.g., by a photolithography process) that meets defined specifications (e.g., for a given technology node, for a given toolset, etc.). Stated another way, a process window may be used to set upper and lower boundaries on focus and exposure, the range of which will still yield patterned resist layers that meet defined specification limits. It will be understood by those skilled in the art that improving (i.e., increasing) the process window size is generally desirable. The continued scaling of IC dimensions, coupled with new patterning techniques (e.g., such as double patterning), has made accurate overlay control more difficult and more critical than ever. Moreover, process windows for aggressively scaled ICs are becoming quite narrow, which can lead to device degradation and/or failure. For at least some conventional processes, the process window of semiconductor fabrication processes used to form such contacts to the metal gate layer, and between the metal gate layer and an adjacent source, drain, and/or body region, has become too narrow and can no longer satisfy process window requirements. Additionally, in some current processes, source and/or drain oxidation may occur during the formation of the contact to the metal gate layer, as a source/drain silicide process is generally performed after formation of the contact to the metal gate layer. Thus, existing methods have not been entirely satisfactory in all respects.

Figure 2:
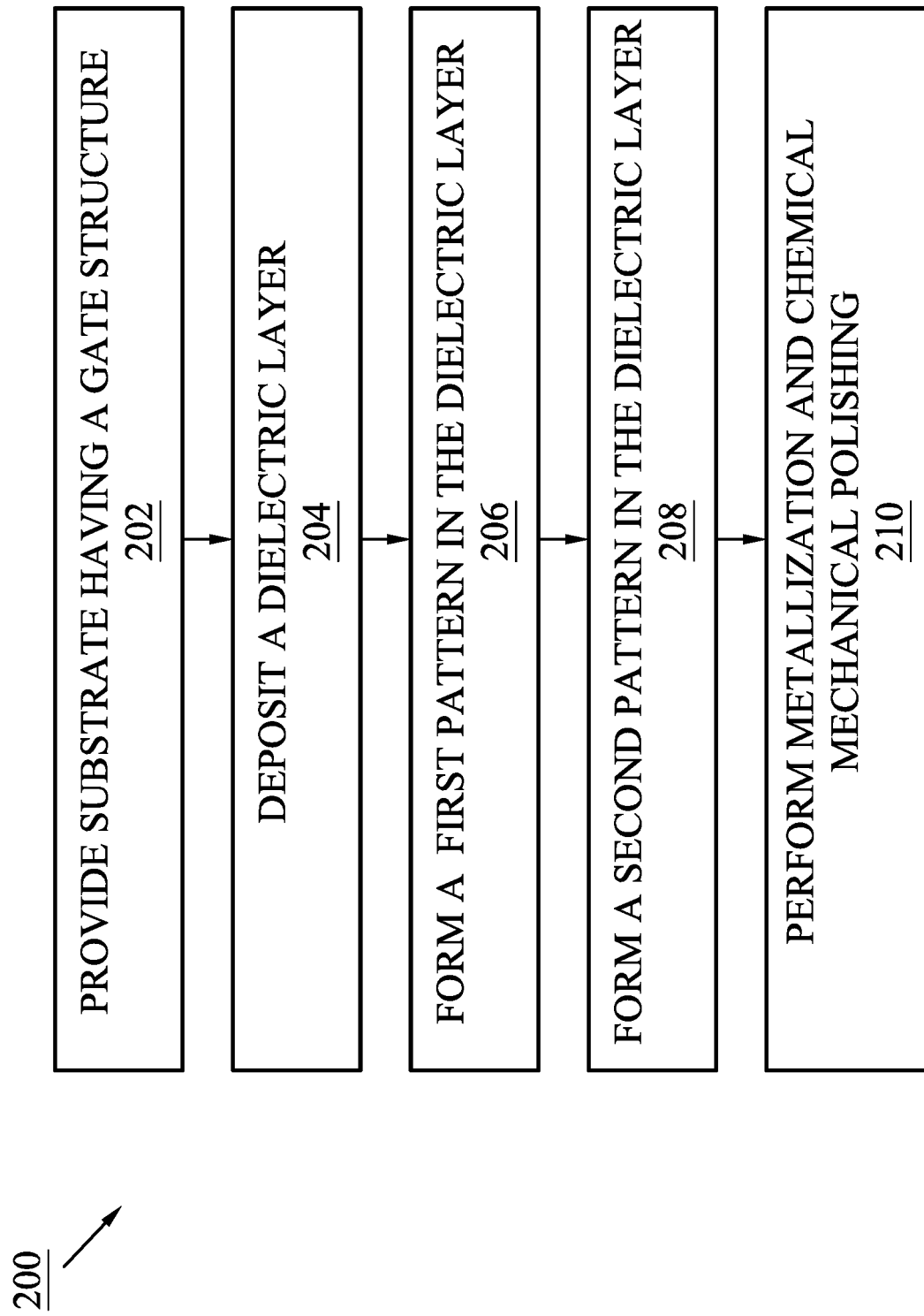
FIG. 2 is a flow chart of a method of forming a direct contact between a metal gate and an adjacent source, drain, and/or body region.
Figures 3, 4:
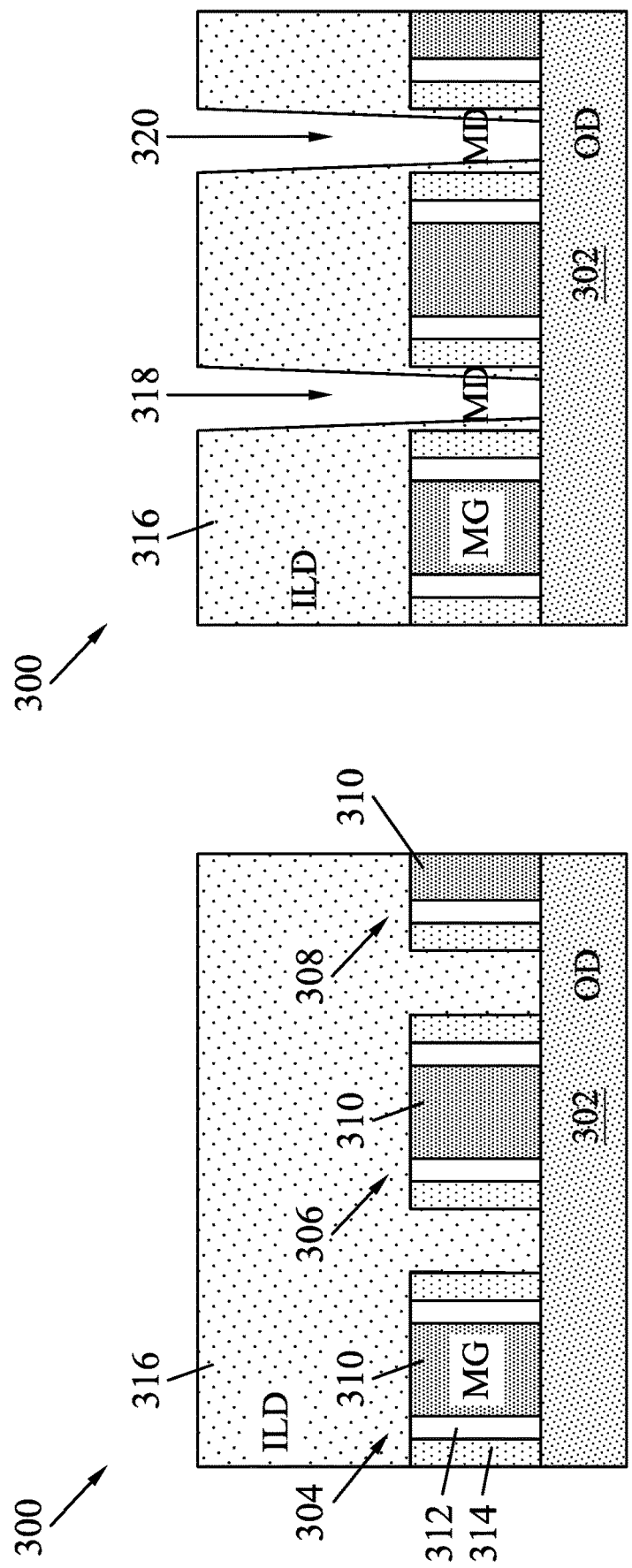
FIGS. 3-6 provide cross-sectional views of a device at intermediate stages of fabrication and processed in accordance with the method of FIG. 2.

To further clarify the shortcomings of some existing process, and with reference to FIG. 2, illustrated is a method 200 of forming a direct contact between a metal gate and an adjacent source, drain, and/or body region, in accordance with at least some conventional processes. The method 200 is described below in more detail with reference to FIGS. 3-6. The method 200 begins at block 202 where a substrate having a gate structure is provided. With reference to FIG. 3, and in an embodiment of block 202, a device 300 having a substrate 302 and including gate structures 304, 306, 308 is provided. In some embodiments, the substrate 302 may be substantially the same as either of the substrates 102, 152, described above. A region of the substrate 302 upon which the gate structures 304, 306, 308 are formed, and including regions of the substrate 302 between adjacent gate structures 304, 306, 308, may include an active region of the substrate 302. In various embodiments, each of the gate structures 304, 306, 308 may include an interfacial layer formed over the substrate 302, a gate dielectric layer formed over the interfacial layer, and a metal gate (MG) layer 310 formed over the gate dielectric layer. In some embodiments, each of the interfacial layer, the dielectric layer, and the metal gate layer 310 of the gate structures 304, 306, 308 may be substantially the same as those described above with respect to the transistor 100 and the FinFET 150. In addition, each of the gate structures 304, 306, 308 may include sidewall spacer layers 312, 314. In some cases, each of the sidewall spacer layers 312, 314 include materials having different dielectric constant values (e.g., k values).

The method 200 proceeds to block 204 where a dielectric layer is deposited over the substrate. Still referring to FIG. 3, and in an embodiment of block 204, a dielectric layer 316 is formed over the substrate 302 and over each of the gate structures 304, 306, 308. By way of example, the dielectric layer 316 may include an inter-layer dielectric (ILD) layer that may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 316 may be deposited by a subatmospheric CVD (SACVD) process, a flowable CVD process, or other suitable deposition technique.

The method 200 proceeds to block 206 where a first pattern is formed in the dielectric layer. With reference to FIGS. 3 and 4, and in an embodiment of block 206, a first pattern, that includes openings 318, 320, is formed within the dielectric layer 316. In some cases, the openings 318, 320 provide access to an adjacent source, drain, or body contact region. By way of example, the openings 318, 320 may be formed by a suitable combination of lithographic patterning and etching (e.g., wet or dry etching) processes.

Figure 5:
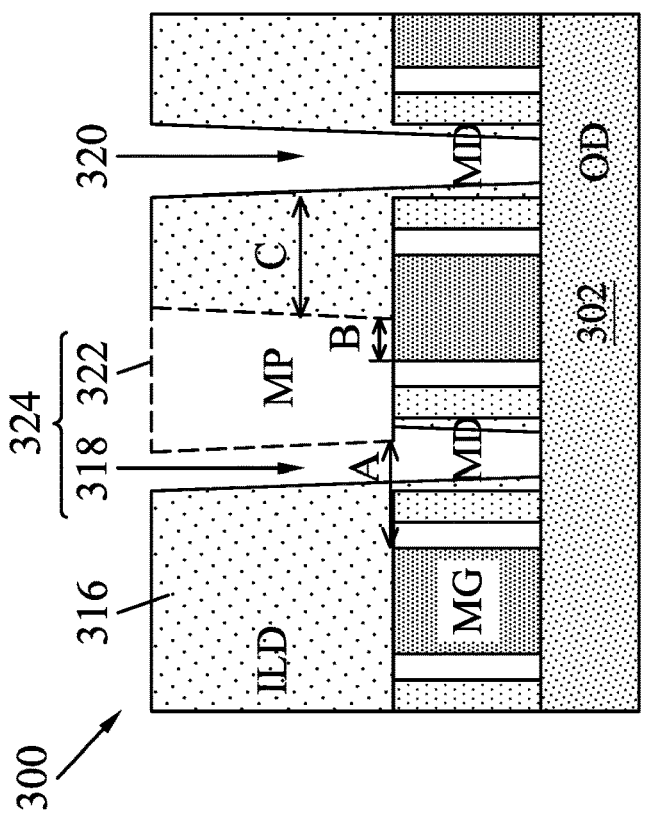

The method 200 proceeds to block 208 where a second pattern is formed in the dielectric layer. With reference to FIGS. 4 and 5, and in an embodiment of block 208, a second pattern, including an opening 322, is formed within the dielectric layer 316. The opening 322 may also be formed by a suitable combination of lithographic patterning and etching (e.g., wet or dry etching) processes. In some cases, the opening 322 provides access to the metal gate layer 310 of the gate structure 306. Further, as illustrated in FIG. 5, the opening 322 may merge with the opening 318 to form a composite opening 324. After deposition of one or more metal layers, as described below, the composite opening 324 thus provides for a direct contact between a metal gate layer and an adjacent source, drain, and/or body region.

FIG. 5 also illustrates various key feature distances which are critical for process window determination. For example, double-arrow A provides a distance between the opening 322 (e.g., including subsequently deposited metal disposed therein) and the metal gate layer 310 of the gate structure 304. In at least some current processes, the distance A is too small, resulting in an unacceptable amount of leakage current. Double-arrow B provides a distance by which the opening 322 (e.g., including subsequently deposited metal disposed therein) overlaps the metal gate layer 310 of the gate structure 306. This overlap may be referred to as the "landing window". In at least some current processes, the distance B and thus the landing window is too small, which can directly impact the quality and reliability of a connection made to the metal gate layer 310 of the gate structure 306. Double-arrow C provides a distance between the opening 322 (e.g., including subsequently deposited metal disposed therein) and the opening 320 (e.g., including subsequently deposited metal disposed therein). In at least some current processes, the distance C is too small, which may also result in an unacceptable amount of leakage current. Thus, for at least some conventional processes, the process window of semiconductor fabrication processes used to form contacts to a metal gate layer, and between the metal gate layer and an adjacent source, drain, and/or body region, has become too narrow and can no longer satisfy process window requirements.

Figure 6:
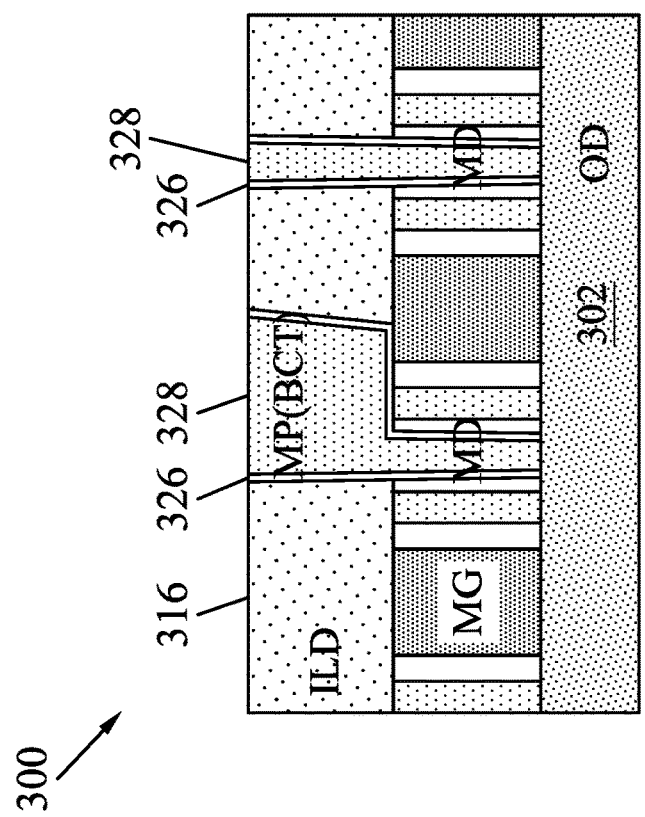

The method 200 proceeds to block 210 where metallization and chemical mechanical polishing processes are performed. With reference to FIGS. 5 and 6, and in an embodiment of block 210, a silicidation process may initially be performed to form a silicide layer on exposed portions of the substrate 302 (e.g., exposed by the composite opening 324 and the opening 320), thus providing a low resistance contact. In some examples, and in a further embodiment of block 210, a glue or barrier layer 326 may be formed within each of the composite opening 324 and the opening 320. In some cases, the glue or barrier layer 326 may include Ti, TiN, Ta, TaN, W, or other appropriate material. Additionally, and in an embodiment of block 210, a metal layer 328 may be formed on the glue or barrier layer 326 within each of the composite opening 324 and the opening 320. In some examples, the metal layer 328 may include W, Cu, Co, Ru, Al, Rh, Mo, Ta, Ti, or other appropriate material. After deposition of the metal layer 328, and in an embodiment of block 210, a chemical mechanical planarization (CMP) process may be performed to remove excess material and planarize the top surface of the device 300. Thus, after deposition of the metal layer 328, a direct contact between a metal gate layer and an adjacent source, drain, and/or body region is provided. As described above, and because of the narrow process window in at least some existing processes, the device 300 may suffer from an unacceptable amount of leakage current (e.g., between the metal layer 328 and the metal gate layer 310 of the gate structure 304 and/or between the metal layer 328 deposited in each of the composite opening 324 and the opening 320). In addition, the landing window on which the metal layer 328 contacts the metal layer 310 of the gate structure 306 may be too small, negatively impacting the quality and reliability of the electrical connection made to the metal gate layer 310 of the gate structure 306. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to a via-first metal gate contact fabrication process. In at least some embodiments, a via-first metal gate contact process is provided in which rather than directly contacting a metal gate to a metal contact layer, as in at least some conventional processes, a gate via is first formed on the metal gate, after which the metal contact layer is formed on the gate via. In various examples, the metal contact layer may further connect to an adjacent source, drain, and/or body region. In some embodiments, the gate via is centered on the metal gate and may provide a larger landing window for the metal contact layer (e.g., as compared to directly contacting the metal gate to the contact metal layer). As a result of adding the gate via between the metal gate and the metal contact layer, the process window is improved (e.g., increased). In addition, employing a gate via as described herein results in the metal contact layer (e.g., which contacts the gate via) to be disposed an increased distance 'Z' (e.g., as compared to at least some conventional processes), in a direction normal to the substrate, thus providing greater isolation between the metal contact layer and neighboring metal gates to which the metal contact layer is not connected. As such, leakage current between the metal contact layer and one or more neighboring metal gates, to which the metal contact layer is not connected, is reduced. Additional details of embodiments of the present disclosure are provided below, and additional benefits and/or other advantages will become apparent to those skilled in the art having benefit of the present disclosure.

Figure 7:
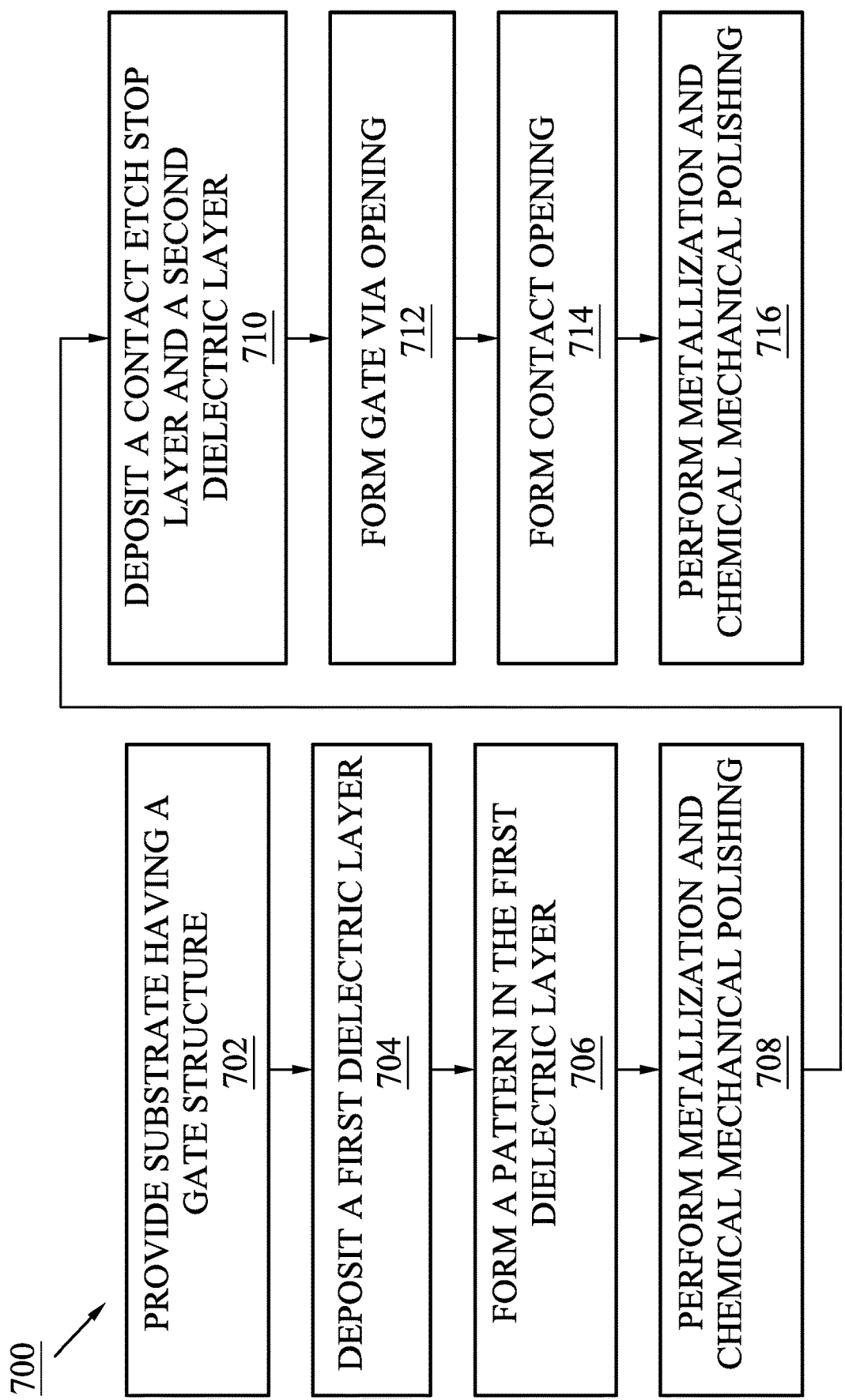
FIG. 7 is a flow chart of a method of forming a via-first metal gate contact, in accordance with some embodiments.

Referring now to FIG. 7, illustrated is a method 700 of forming a via-first metal gate contact, in accordance with some embodiments. The method 700 is described below in more detail with reference to FIGS. 8-14. The method 700 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 700. To be sure, in various embodiments, the method 700 may be implemented on other devices such as gate-all-around (GAA) devices, Omega-gate (Q-gate) devices, or Pi-gate (I-gate) devices, as well as strained-semiconductor devices, silicon-on-insulator (SOI) devices, partially-depleted SOI (PD-SOI) devices, fully-depleted SOI (FD-SOI) devices, or other devices as known in the art.

It is understood that parts of the method 700 and/or any of the exemplary transistor devices discussed with reference to the method 700 may be fabricated by a well-known complementary metal-oxide-semiconductor (CMOS) technology process flow, and thus some processes are only briefly described herein. For the sake of clarity, certain aspects of the method 700 that are shared with the method 200 may be only discussed briefly. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Figures 8, 9:
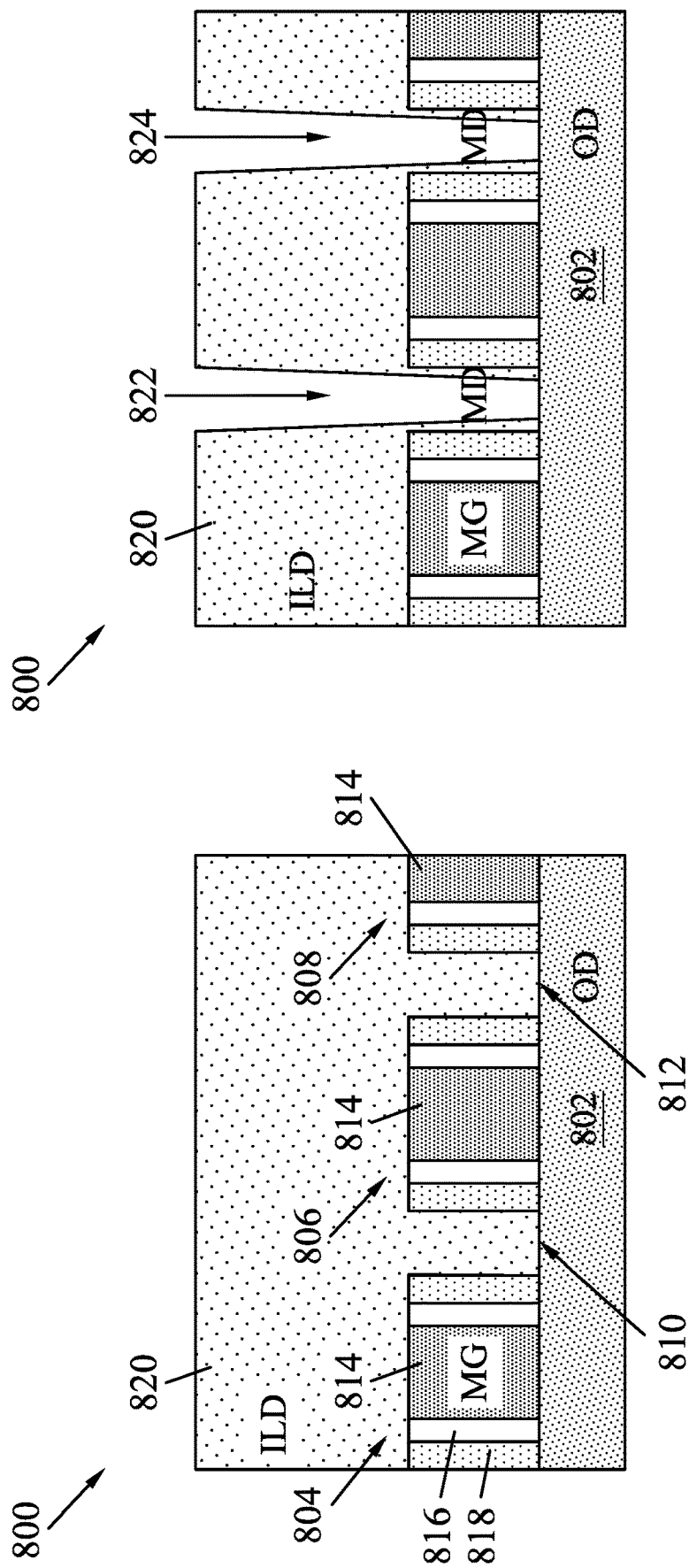
FIGS. 8-14 provide cross-sectional views of a device at intermediate stages of fabrication and processed in accordance with the method of FIG. 7.

The method 700 begins at block 702 where a substrate having a gate structure is provided. With reference to FIG. 8, and in an embodiment of block 702, a device 800 having a substrate 802 and including gate structures 804, 806, 808 is provided. In some embodiments, the substrate 802 may be substantially the same as either of the substrates 102, 152, described above. A region of the substrate 802 upon which the gate structures 804, 806, 808 are formed, and including regions of the substrate 802 between adjacent gate structures 804, 806, 808, may include an active region of the substrate 802. It will be understood that the device 800 is merely illustrative, and is provided for clarity of discussion regarding subsequent formation of the via-first metal gate contact. For example, in some cases, the device 800 may include a planar device, such as the transistor 100. Alternatively, in some examples, the device 800 may include a multi-gate device, such as the FinFET 150. Moreover, in some cases, the device 800 may include a GAA device, an Q-gate device, a I-gate device, a strained-semiconductor device, an SOI device, a PD-SOI device, a FD-SOI device, or other device as known in the art. In some embodiments, the device 800 includes regions 810, 812, adjacent to the gate structures 804, 806, 808, where the regions 810, 812 may include a source region, a drain region, or a body contact region. In various embodiments, each of the gate structures 804, 806, 808 may include an interfacial layer formed over the substrate 802, a gate dielectric layer formed over the interfacial layer, and a metal gate (MG) layer 814 formed over the gate dielectric layer. In some embodiments, each of the interfacial layer, the dielectric layer, and the metal gate layer 814 of the gate structures 804, 806, 808 may be substantially the same as those described above with respect to the transistor 100 and the FinFET 150. In addition, each of the gate structures 804, 806, 808 may include sidewall spacer layers 816, 818. In some cases, each of the sidewall spacer layers 816, 818 include materials having different dielectric constant values (e.g., k values). In various embodiments, the sidewall spacer layers 816, 818 include $SiO_x$, SiN, $SiO_xN_y$, $SiC_xN_y$, $SiO_xC_yN_z$, $AlO_x$, $AlO_xN_y$, AlN, HfO, ZrO, HfZrO, CN, poly-Si, combinations thereof, or other suitable dielectric materials. In some embodiments, the sidewall spacer layers 816, 818 include multiple layers, such as main spacer walls, liner layers, and the like. By way of example, the sidewall spacer layers 816, 818 may be formed by depositing a dielectric material over the device 800 and anisotropically etching back the dielectric material. In some embodiments, the etch-back process (e.g., for spacer formation) may include a multiple-step etching process to improve etch selectivity and provide over-etch control.

The method 700 proceeds to block 704 where a first dielectric layer is deposited over the substrate. Still referring to FIG. 8, and in an embodiment of block 704, a dielectric layer 820 is formed over the substrate 802 and over each of the gate structures 804, 806, 808. By way of example, the dielectric layer 820 may include an inter-layer dielectric (ILD) layer that may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The dielectric layer 820 may be deposited by a subatmospheric CVD (SACVD) process, a flowable CVD process, or other suitable deposition technique. In some embodiments, the dielectric layer 820 has a thickness of about 5-40 nm.

The method 700 proceeds to block 706 where a pattern is formed in the dielectric layer. With reference to FIGS. 8 and 9, and in an embodiment of block 706, a pattern, that includes openings 822, 824, is formed within the dielectric layer 820. In some cases, the openings 822, 824 provide access to regions 810, 812, adjacent to the gate structures 804, 806, 808, where the regions 810, 812 may include a source region, a drain region, or a body contact region. By way of example, the openings 822, 824 may be formed by a suitable combination of lithographic patterning and etching (e.g., wet or dry etching) processes. In some embodiments, the openings 822, 824 have a width of about 12-25 nm.

Figure 10:
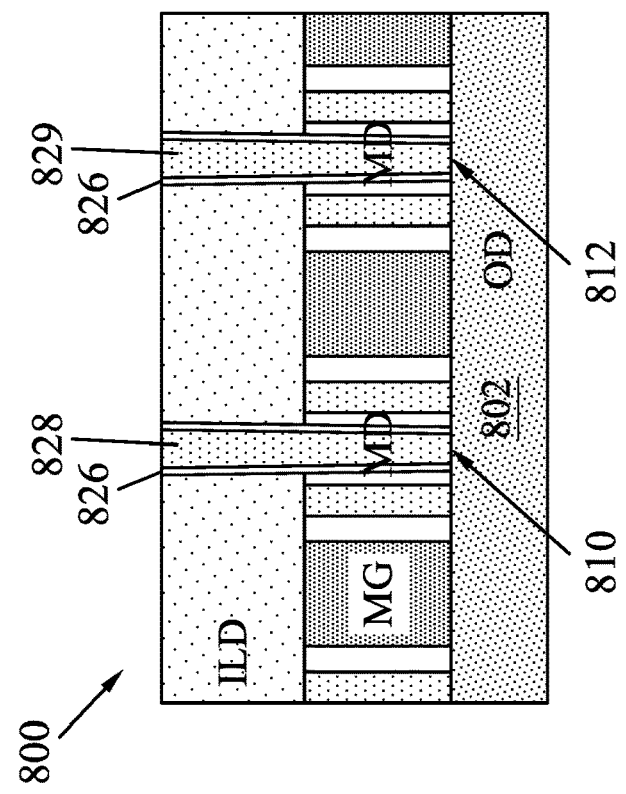

The method 700 proceeds to block 708 where metallization and chemical mechanical polishing processes are performed. With reference to FIGS. 9 and 10, and in an embodiment of block 708, a silicidation process may initially be performed to form a silicide layer on exposed portions of the substrate 802 (e.g., exposed by the openings 822, 824) in the regions 810, 812, thus providing a low resistance contact thereto. In some examples, and in a further embodiment of block 708, a glue or barrier layer 826 may be formed within each of the openings 822, 824. In some cases, the glue or barrier layer 826 may include Ti, TiN, Ta, TaN, W, or other appropriate material. In some embodiments, the glue or barrier layer 826 has a thickness of about 1-4 nm. Additionally, and in an embodiment of block 708, metal layers 828, 829 may be formed on the glue or barrier layer 826 within each of the openings 822, 824. In some examples, the metal layers 828, 829 may include W, Cu, Co, Ru, Al, Rh, Mo, Ta, Ti, TiN, TaN, WN, silicides, or other suitable conductive material. In some cases, the metal layers 828 and 829 may include the same material and may deposited together as part of a single deposition process. In some embodiments, the metal layers 828, 829 may have a width of about 10-20 nm and a height of about 30-60 nm. After deposition of the metal layers 828, 829, and in an embodiment of block 708, a chemical mechanical planarization (CMP) process may be performed to remove excess material and planarize the top surface of the device 800.

Figure 11:
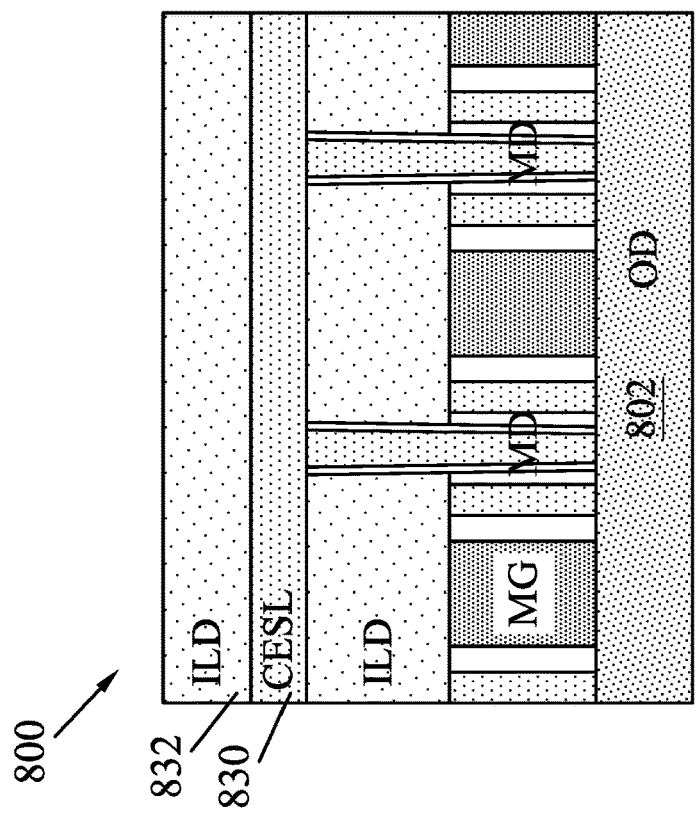

The method 700 proceeds to block 710 where a contact etch stop layer and a second dielectric layer are deposited over the substrate. Referring to FIGS. 10 and 11, and in an embodiment of block 710, a contact etch stop layer (CESL) 830 is formed over the substrate 802, and a dielectric layer 832 is formed over the contact etch stop layer 830. By way of example, the contact etch stop layer 830 may include Ti, TiN, TiC, TiCN, Ta, TaN, TaC, TaCN, W, WN, WC, WCN, TiAl, TiAlN, TiAlC, TiAlCN, or combinations thereof. In some embodiments, the dielectric layer 832 may include an inter-layer dielectric (ILD) layer that may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. Thus, in some cases, the dielectric layer 832 may be substantially the same as the dielectric layer 820. In various embodiments, the CESL 830 and the dielectric layer 832 may be deposited by a subatmospheric CVD (SACVD) process, a flowable CVD process, an ALD process, a PVD process, or other suitable deposition technique. In some examples, the CESL 830 has a thickness of about 5-20 nm, and the dielectric layer 832 has a thickness of about 5-40 nm.

Figure 12:
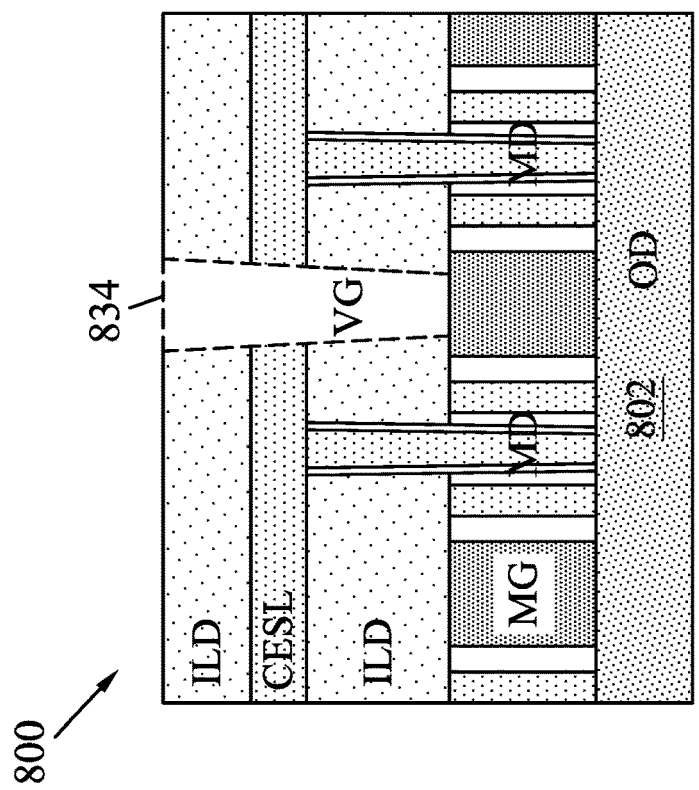

The method 700 proceeds to block 712 where a gate via opening is formed. With reference to FIGS. 11 and 12, and in an embodiment of block 712, a gate via opening 834 is formed. By way of example, the gate via opening 834 provides access to the metal gate layer 814 of the gate structure 806. By way of example, the gate via opening 834 may be formed by a suitable combination of lithographic patterning and etching (e.g., wet or dry etching) processes. In some cases, the gate via opening 834 has a width of about 12-25 nm. In some embodiments, one or more etching processes may be used to etch through each of the dielectric layer 832, the contact etch stop layer 830, and the dielectric layer 820, in sequence. In various embodiments, the gate via opening 834 is substantially aligned (e.g., centered) with the metal gate layer 814 of the gate structure 806. In addition, it will be understood that similar gate via openings may be formed to provide access to the metal gate layer 814 of the gate structures 804, 808, or to other gate structures not explicitly shown.

Figure 13:
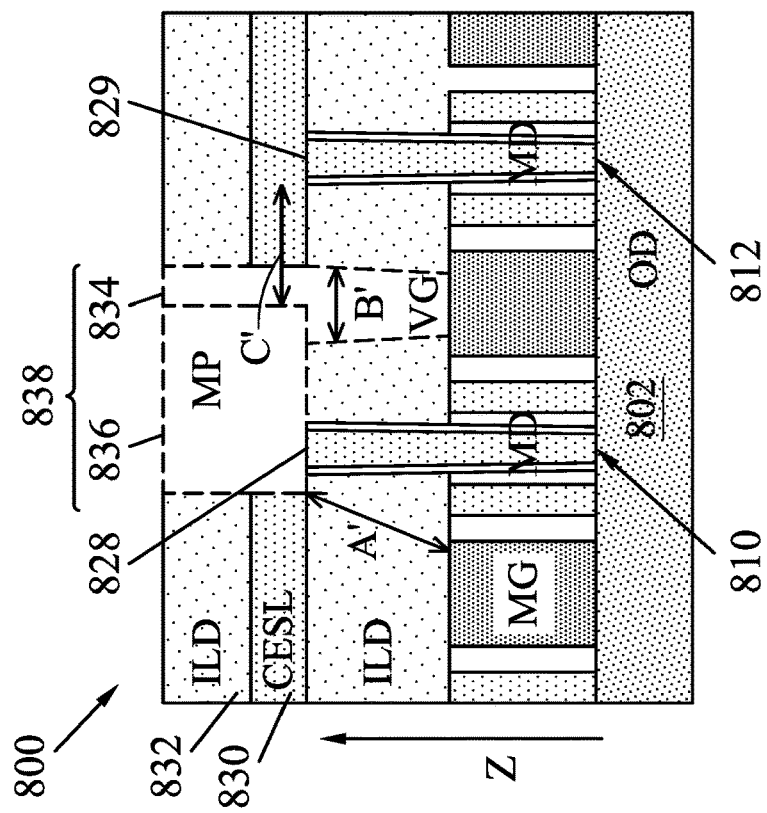

The method 700 proceeds to block 714 where a contact opening is formed. With reference to FIGS. 12 and 13, and in an embodiment of block 714, a contact opening 836 is formed. The contact opening 836 may also be formed by a suitable combination of lithographic patterning and etching (e.g., wet or dry etching) processes. In some examples, the contact opening 836 has a width of about 30-60 nm. In some embodiments, one or more etching processes may be used to etch through each of the dielectric layer 832 and the contact etch stop layer 830, in sequence. In some cases, the contact opening 836 provides access to the metal layer 828. Further, as illustrated in FIG. 13, the contact opening 836 may merge/overlap with the gate via opening 834 to form a composite opening 838. In some embodiments, the contact opening 836 and the gate via opening 834 overlap each other by about 0-20 nm. After deposition of one or more metal layers, as described below, the composite opening 838 thus provides for contact between a metal gate layer and an adjacent source, drain, and/or body region. However, because of the via-first process described herein, shortcomings of at least some current processes may be overcome.

For example, FIG. 13 also illustrates various key feature distances which are critical for process window determination. In particular, when compared with the feature distances of at least some current processes (e.g., shown in FIG. 5), the benefits of the present disclosure are clear. For example, double-arrow A-prime (A') provides a distance between the contact opening 836 (e.g., including subsequently deposited metal disposed therein) and the metal gate layer 814 of the gate structure 804. Compared to some current processes, and in some embodiments, the distance represented by double-arrow A' (FIG. 13) is greater than the distance represented by double-arrow A (FIG. 5). Thus, in some embodiments, and because of the increased distance 'Z' (e.g., in a direction normal to the substrate) of the metal within the contact opening 836, embodiments of the present disclosure provide greater isolation between the metal within the contact opening 836 and neighboring metal gates to which the metal contact layer is not connected (e.g., such as the metal gate layer 814 of the gate structure 804). As such, leakage current between the metal within the contact opening 836 and the metal gate layer 814 of the gate structure 804 is reduced.

As another example, double-arrow B-prime (B') provides a distance of an available landing window within which the contact opening 836 (e.g., including subsequently deposited metal disposed therein) may overlap the gate via opening 834 (e.g., including subsequently deposited metal disposed therein). Compared to some current processes, and in some embodiments, the distance represented by double-arrow B' (FIG. 13) is greater than the distance represented by double-arrow B (FIG. 5). Thus, in some embodiments, and because of the increased landing window provided by the via-first process disclosed herein, embodiments of the present disclosure provide higher quality and more robust gate connections.

As a further example, double-arrow C-prime (C') provides a distance between the contact opening 836 (e.g., including subsequently deposited metal disposed therein) and the metal layer 829. Compared to some current processes, and in some embodiments, the distance represented by double-arrow C' (FIG. 13) is greater than the distance represented by double-arrow C (FIG. 5). Thus, in some embodiments, and because of the increased distance 'Z' (e.g., in a direction normal to the substrate) of the metal within the contact opening 836, embodiments of the present disclosure provide greater isolation between the metal within the contact opening 836 and the metal layer 829. As such, leakage current between the metal within the contact opening 836 and the metal layer 829 is reduced.

Thus, embodiments of the present disclosure provide for an improved (i.e., increased) process window for the formation of contacts to a metal gate layer, and between the metal gate layer and an adjacent source, drain, and/or body region. In some cases, the process window may be improved by 10 nm (e.g., with respect to the key feature distance represented by double-arrow A'). In some embodiments, the process window may be improved by at least 3 nm (e.g., with respect to key feature distances represented by double-arrow B' and C').

Figures 14, 15:
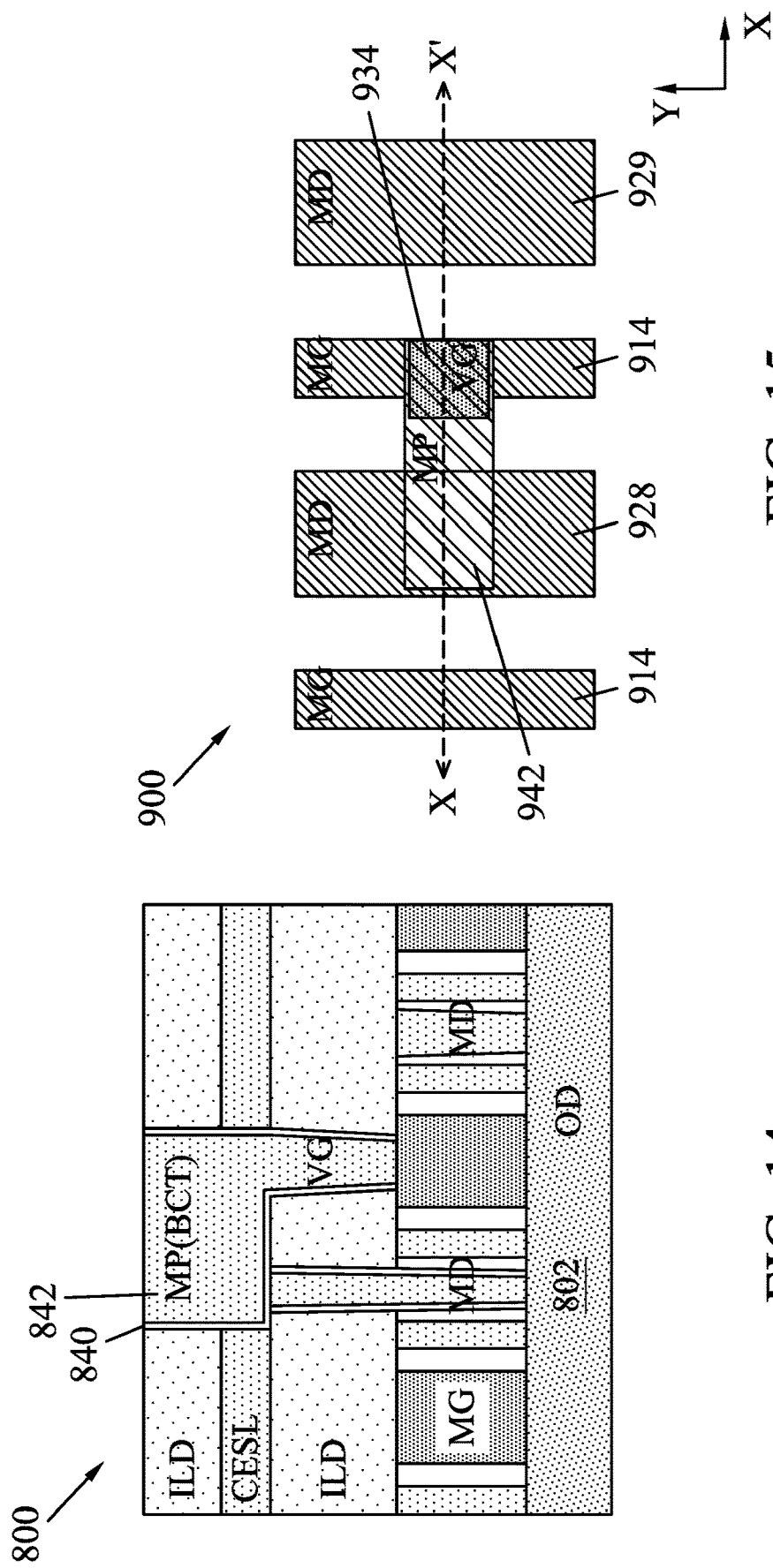
FIG. 15 provides a layout design illustrating various aspects of some embodiments of the present disclosure.

The method 700 proceeds to block 716 where metallization and chemical mechanical polishing processes are performed. With reference to FIGS. 13 and 14, and in an embodiment of block 716, a glue or barrier layer 840 may be formed within the composite opening 838. In some cases, the glue or barrier layer 840 may include Ti, TiN, Ta, TaN, W, or other appropriate material. In some embodiments, the glue or barrier layer 840 has a thickness of about 1-4 nm. Additionally, and in an embodiment of block 716, a metal layer 842 may be formed on the glue or barrier layer 840 within the composite opening 838. In some examples, the metal layer 842 may include W, Cu, Co, Ru, Al, Rh, Mo, Ta, Ti, or other conductive material. It is noted that metal layer 842 within the composite opening 838 may be equivalently described as the metal layer 842 formed within each of the contact opening 836 and the gate via opening 834, where the contact opening 836 and the gate via opening 834 merge/overlap, as described above. Thus, in some embodiments and within a region of the contact opening 836, the metal layer 842 may have a width of about 30-60 nm and a height of about 10-30 nm. Additionally, in some embodiments and within a region of the gate via opening 834, the metal layer 842 may have a width of about 10-25 nm and a height of about 20-45 nm. In some examples, the width of the metal layer 842 across the length of the composite opening 838, including both the contact opening 836 and the gate via opening 834, may be about 30-85 nm. After deposition of the metal layer 842, and in an embodiment of block 716, a chemical mechanical planarization (CMP) process may be performed to remove excess material and planarize the top surface of the device 800. Thus, after deposition of the metal layer 842, contact is made, through a metal gate via, between a metal gate layer and an adjacent source, drain, and/or body region. As described above, and because of the improved (i.e., increased) process window provided by the embodiments disclosed herein, the device 800 is more robust (e.g., as compared to at least some current devices).

With reference to FIG. 15, illustrated therein is a layout design 900, which effectively provides a top schematic view of the device 800, discussed above. In some embodiments, the cross-section views of the device 800 shown in FIGS. 8-14 are provided along a plane substantially parallel to the line X-X', illustrated in FIG. 15. The layout design 900 of FIG. 15 further illustrates metal gate layers 914, which may be the metal gate layers 814 described above; metal layers 928 and 929, which may be the metal layers 828, 829 described above; metal layer 942, which may be the metal layer 842 described above; and gate via 934, which may be the gate via formed in the gate via opening 834 described above. By way of example, and in some embodiments, the metal layer 942 may have a length of about 30-60 nm along an X-axis, and a width of about 10-30 nm along a Y-axis. In some examples, the gate via 934 may have a length of about 10-25 nm along the X-axis, and a width of about 10-25 nm along the Y-axis. Additionally, in some embodiments, the metal gate layers 914 may have a width of about 4-10 nm along the X-axis, and the metal layers 928, 928 may have a width of about 10-30 nm along the X-axis.

Figure 16:
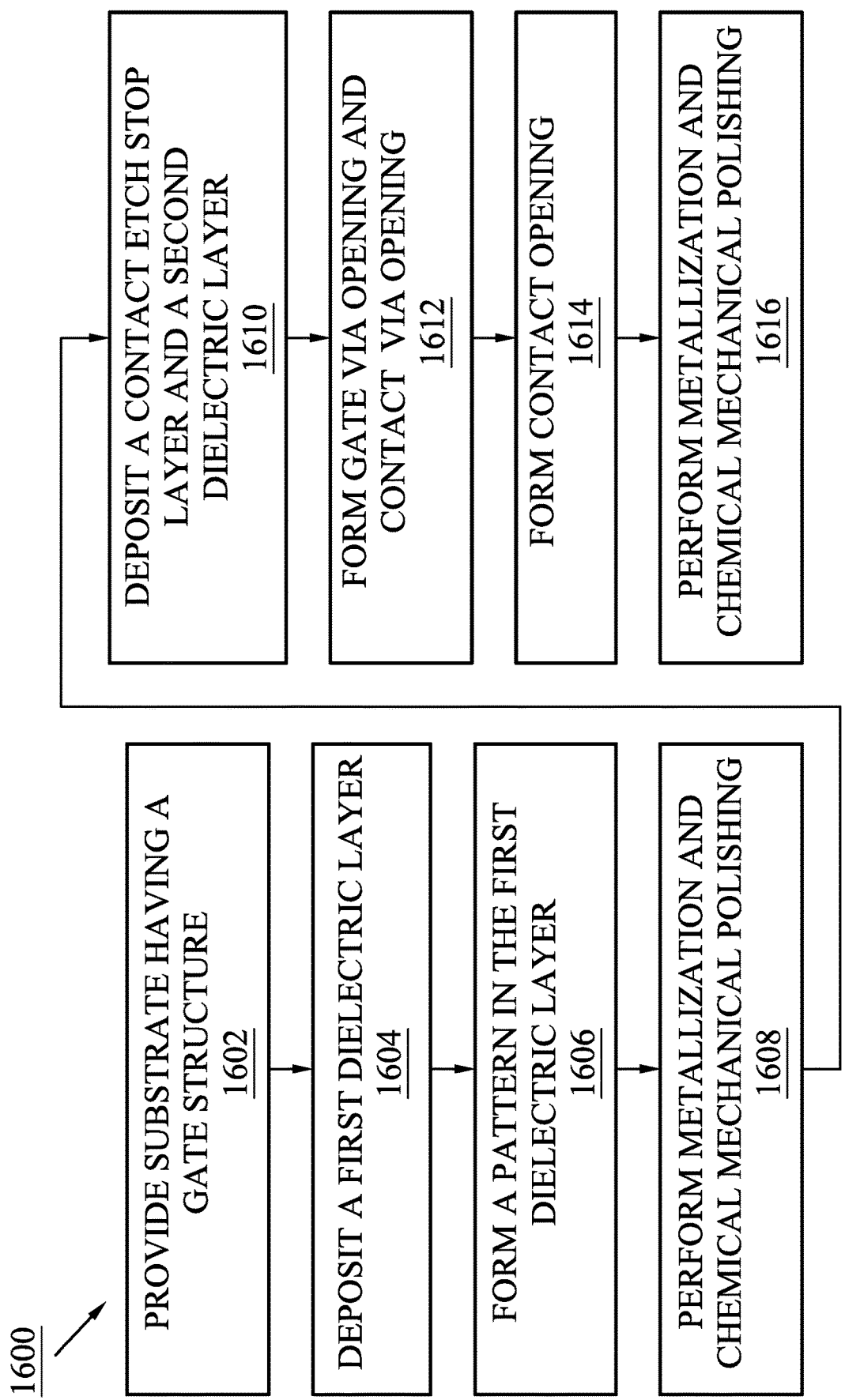
FIG. 16 is a flow chart of an alternative method of forming a via-first metal gate contact, in accordance with some embodiments.

Referring now to FIG. 16, illustrated is an alternative method 1600 of forming a via-first metal gate contact, in accordance with some embodiments. Generally, while the method 700 described a via-first process including a via on a gate structure, the method 1600 shows a via-first process including a via on a gate structure and a via on metal contact to an adjacent source region, a drain region, or a body contact region. The method 1600 is described below in more detail with reference to FIGS. 17-23. The method 1600 may be implemented on a single-gate planar device, such as the exemplary transistor 100 described above with reference to FIG. 1A, as well as on a multi-gate device, such as the FinFET device 150 described above with reference to FIG. 1B. Thus, one or more aspects discussed above with reference to the transistor 100 and/or the FinFET 150 may also apply to the method 1600. To be sure, in various embodiments, the method 1600 may be implemented on other devices such as gate-all-around (GAA) devices, Omega-gate (Q-gate) devices, or Pi-gate (I-gate) devices, as well as strained-semiconductor devices, silicon-on-insulator (SOI) devices, partially-depleted SOI (PD-SOI) devices, fully-depleted SOI (FD-SOI) devices, or other devices as known in the art.

It is understood that parts of the method 1600 and/or any of the exemplary transistor devices discussed with reference to the method 1600 may be fabricated by a well-known complementary metal-oxide-semiconductor (CMOS) technology process flow, and thus some processes are only briefly described herein. For the sake of clarity, certain aspects of the method 1600 that are shared with the method 200 or the method 700 may be only discussed briefly. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

The method 1600 begins at block 1602 where a substrate having a gate structure is provided. With reference to FIG.

17, and in an embodiment of block 1602, a device 1700 having a substrate 1702 and including gate structures 1704, 1706, 1708 is provided. In some embodiments, the substrate 1702 may be substantially the same as either of the substrates 102, 152, described above. A region of the substrate 1702 upon which the gate structures 1704, 1706, 1708 are formed, and including regions of the substrate 1702 between adjacent gate structures 1704, 1706, 1708, may include an active region of the substrate 1702. It will be understood that the device 1700 is merely illustrative, and is provided for clarity of discussion. Additionally, in some cases, the device 1700 may include a planar device, a multi-gate device, or other device, as described above. In some embodiments, the device 1700 includes regions 1710, 1712, adjacent to the gate structures 1704, 1706, 1708, where the regions 1710, 1712 may include a source region, a drain region, or a body contact region. In various embodiments, each of the gate structures 1704, 1706, 1708 may include an interfacial layer formed over the substrate 1702, a gate dielectric layer formed over the interfacial layer, and a metal gate (MG) layer 1714 formed over the gate dielectric layer. In some embodiments, each of the interfacial layer, the dielectric layer, and the metal gate layer 1714 of the gate structures 1704, 1706, 1708 may be substantially the same as those described above with respect to the transistor 100 and the FinFET 150. In addition, each of the gate structures 1704, 1706, 1708 may include sidewall spacer layers 1716, 1718. In some cases, each of the sidewall spacer layers 1716, 1718 include materials having different dielectric constant values (e.g., k values), may include one or more of the materials described above, and may be formed by the methods described above.

The method 1600 proceeds to block 1604 where a first dielectric layer is deposited over the substrate. Still referring to FIG. 17, and in an embodiment of block 1604, a dielectric layer 1720 is formed over the substrate 1702 and over each of the gate structures 1704, 1706, 1708. By way of example, the dielectric layer 1720 may include an inter-layer dielectric (ILD) layer that that may include one or more of the materials described above, and may be formed by one or more of the methods described above. In some embodiments, the dielectric layer 1720 has a thickness of about 5-40 nm.

The method 1600 proceeds to block 1606 where a pattern is formed in the dielectric layer. With reference to FIGS. 17 and 18, and in an embodiment of block 1606, a pattern, that includes openings 1722, 1724, is formed within the dielectric layer 1720. In some cases, the openings 1722, 1724 provide access to regions 1710, 1712, adjacent to the gate structures 1704, 1706, 1708, where the regions 1710, 1712 may include a source region, a drain region, or a body contact region. The openings 1722, 1724 may be formed by a suitable combination of lithographic patterning and etching (e.g., wet or dry etching) processes. In some embodiments, the openings 1722, 1724 have a width of about 12-25 nm.

Figure 19:
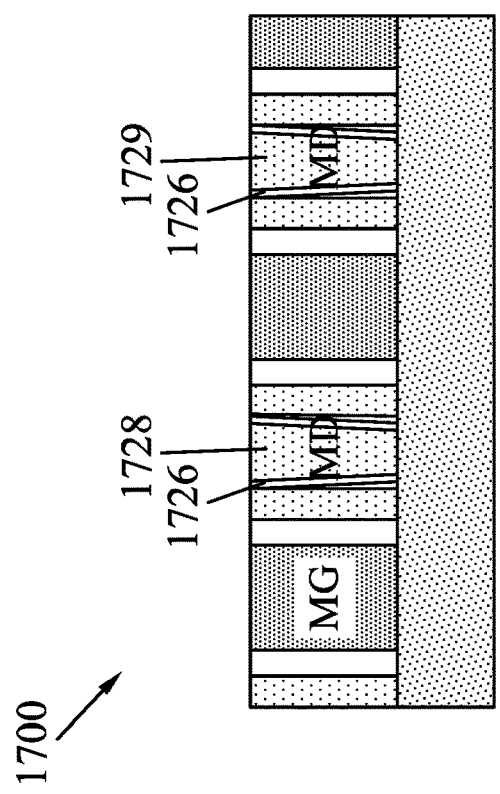

The method 1600 proceeds to block 1608 where metallization and chemical mechanical polishing processes are performed. With reference to FIGS. 18 and 19, and in an embodiment of block 1608, a silicidation process may initially be performed to form a silicide layer on exposed portions of the substrate 1702 (e.g., exposed by the openings 1722, 1724) in the regions 1710, 1712, thus providing a low resistance contact thereto. In some examples, and in a further embodiment of block 1608, a glue or barrier layer 1726 may be formed within each of the openings 1722, 1724. In some cases, the glue or barrier layer 1726 may include Ti, TiN, Ta, TaN, W, or other appropriate material. In some embodiments, the glue or barrier layer 1726 has a thickness of about 1-4 nm. Additionally, and in an embodiment of block 1608, metal layers 1728, 1729 may be formed on the glue or barrier layer 1726 within each of the openings 1722, 1724. In some examples, the metal layers 1728, 1729 may include W, Cu, Co, Ru, Al, Rh, Mo, Ta, Ti, TiN, TaN, WN, silicides, or other suitable conductive material. In some cases, the metal layers 1728 and 1729 may include the same material and may deposited together as part of a single deposition process. In some embodiments, the metal layers 1728, 1729 may have a width of about 10-20 nm and a height of about 30-60 nm. After deposition of the metal layers 1728, 1729, and in an embodiment of block 1608, a chemical mechanical planarization (CMP) process may be performed to remove excess material and planarize the top surface of the device 1700. In contrast to block 708 of the method 700, where a portion of the dielectric layer 820 remains after the CMP process, the CMP process of block 1608 may polish down to (e.g., stops on) a top surface of the metal gate layer 1714, thus removing substantially all of the dielectric layer 1720.

Figure 20:
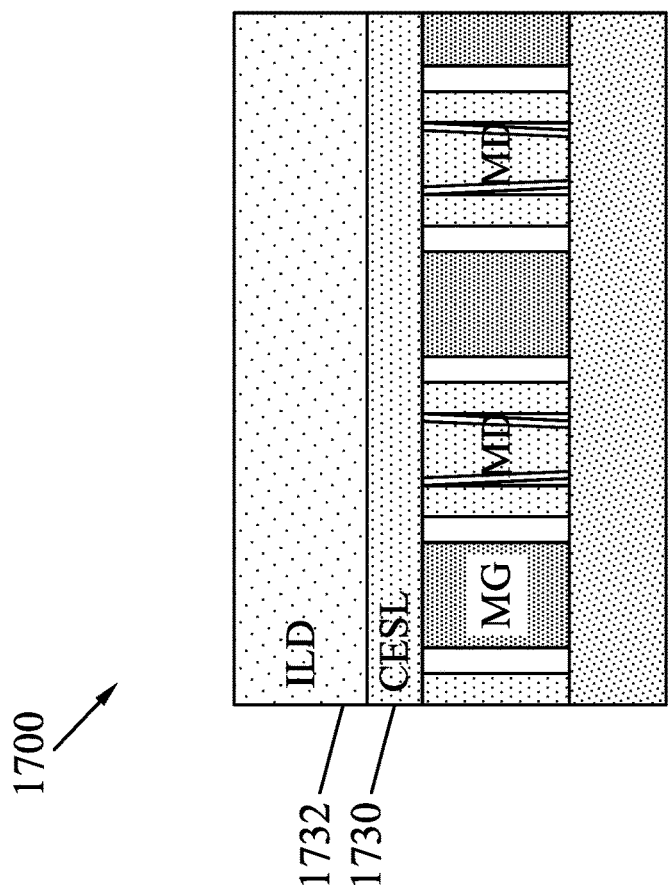

The method 1600 proceeds to block 1610 where a contact etch stop layer and a second dielectric layer are deposited over the substrate. Referring to FIGS. 19 and 20, and in an embodiment of block 1610, a contact etch stop layer (CESL) 1730 is formed over the substrate 1702, and a dielectric layer 1732 is formed over the contact etch stop layer 1730. By way of example, the contact etch stop layer 1730 may include Ti, TiN, TiC, TiCN, Ta, TaN, TaC, TaCN, W, WN, WC, WCN, TiAl, TiAlN, TiAlC, TiAlCN, or combinations thereof. In some embodiments, the dielectric layer 1732 may include an inter-layer dielectric (ILD) layer that that may include one or more of the materials described above, and may be formed by one or more of the methods described above. In some examples, the CESL 1730 has a thickness of about 5-20 nm, and the dielectric layer 1732 has a thickness of about 5-40 nm.

Figure 21:
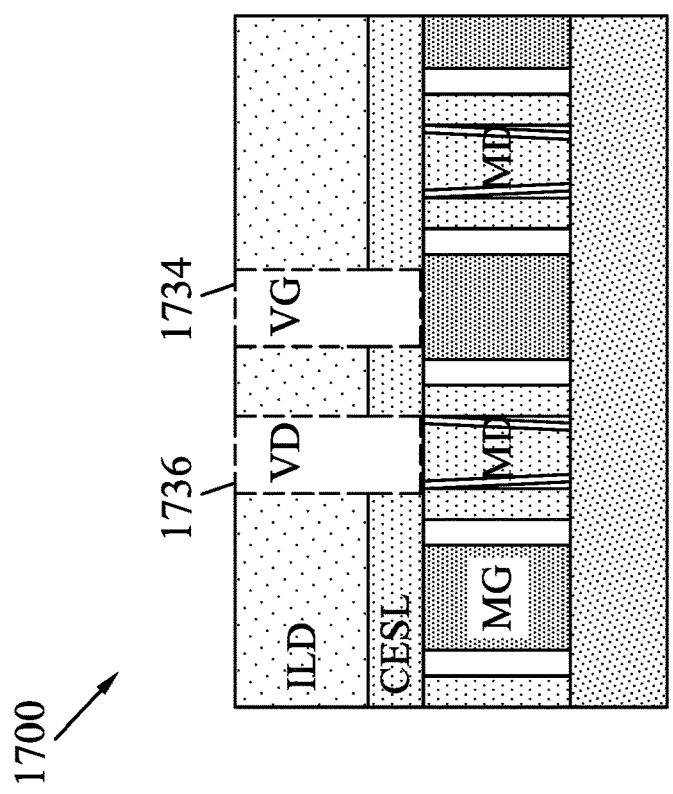

The method 1600 proceeds to block 1612 where a gate via opening and a contact via opening are formed. With reference to FIGS. 20 and 21, and in an embodiment of block 1612, a gate via opening 1734 and a contact via opening 1736 are formed. By way of example, the gate via opening 1734 provides access to the metal gate layer 1714 of the gate structure 1706, and the contact via opening 1736 provides access to the metal layer 1728. By way of example, the gate via opening 1734 and the contact via opening 1736 may be formed by a suitable combination of lithographic patterning and etching (e.g., wet or dry etching) processes. In some cases, the gate via opening 1734 and the contact via opening 1736 each have a width of about 12-25 nm. In some embodiments, one or more etching processes may be used to etch through each of the dielectric layer 1732 and the contact etch stop layer 1730 in sequence. As described above, and in various embodiments, the gate via opening 1734 is substantially aligned (e.g., centered) with the metal gate layer 1714 of the gate structure 1706. Similarly, in some embodiments, the contact via opening 1736 is substantially aligned (e.g., centered) with the metal layer 1728.

Figure 22:
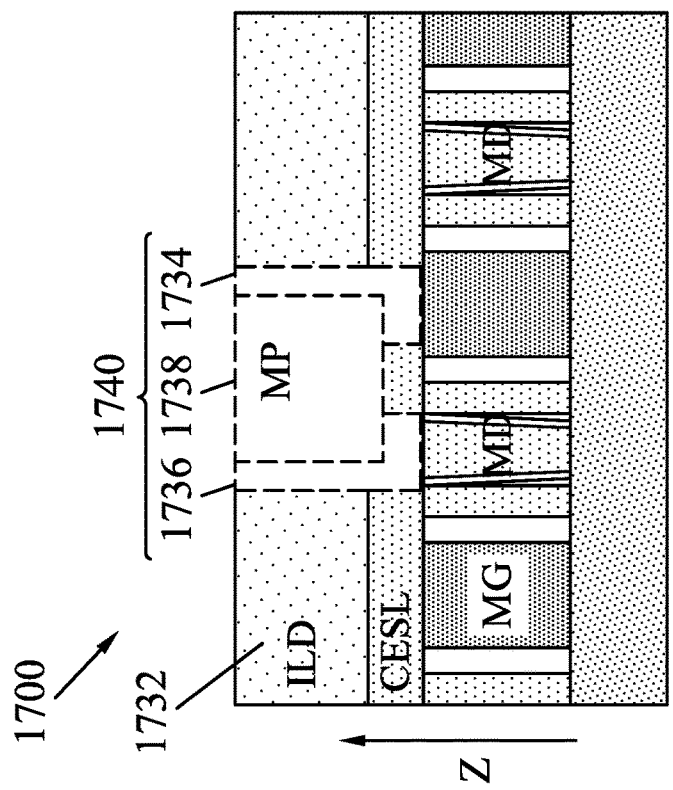

The method 1600 proceeds to block 1614 where a contact opening is formed. With reference to FIGS. 21 and 22, and in an embodiment of block 1614, a contact opening 1738 is formed. The contact opening 1738 may also be formed by a suitable combination of lithographic patterning and etching (e.g., wet or dry etching) processes. In some examples, the contact opening 1738 has a width of about 30-60 nm. In some embodiments, the etching process may etch the dielectric layer 1732 and stop on the contact etch stop layer 1730. In some cases, the contact opening 1738 may merge/overlap with the gate via opening 1734 and the contact via opening 1736 to form a composite opening 1740. In some embodiments, the contact opening 1738 overlaps each of the gate via opening 1734 and the contact via opening 1736 by about 0-20 nm. After deposition of one or more metal layers, as described below, the composite opening 1740 thus provides for contact between a metal gate layer and an adjacent source, drain, and/or body region.

It is noted that embodiments described with respect to the method 1600 also provide for an increased distance 'Z' (e.g., in a direction normal to the substrate) of the metal within the contact opening 1738, thereby providing greater isolation between the metal within the contact opening 1738 and neighboring metal gates, or other metal contacts, to which the metal contact layer is not connected (e.g., such as the metal gate layer 1714 of the gate structure 1704, or the metal layer 1729). As such, leakage current may be reduced. In addition, embodiments described with respect to the method 1600 also provide an increased landing window, ensuring higher quality and more robust connections.

Figure 23:
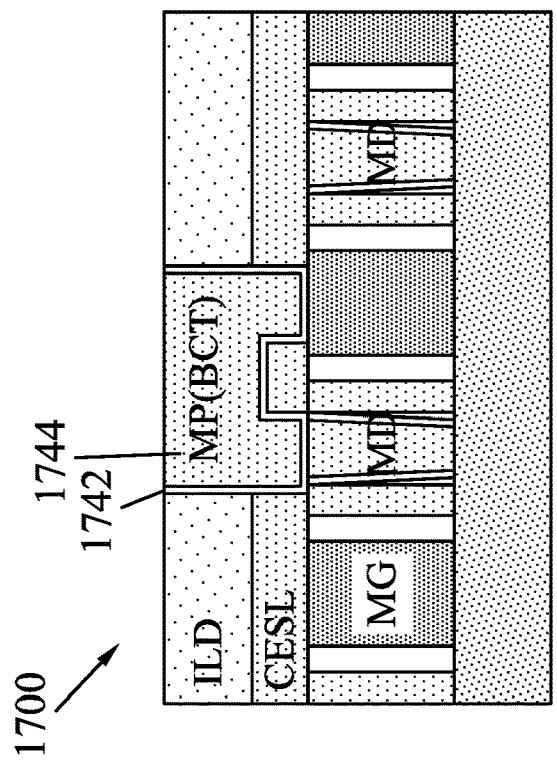

The method 1600 proceeds to block 1616 where metallization and chemical mechanical polishing processes are performed. With reference to FIGS. 22 and 23, and in an embodiment of block 1616, a glue or barrier layer 1742 may be formed within the composite opening 1740. In some cases, the glue or barrier layer 1742 may include Ti, TiN, Ta, TaN, W, or other appropriate material. In some embodiments, the glue or barrier layer 1742 has a thickness of about 1-4 nm. Additionally, and in an embodiment of block 1616, a metal layer 1744 may be formed on the glue or barrier layer 1742 within the composite opening 1740. In some examples, the metal layer 1744 may include W, Cu, Co, Ru, Al, Rh, Mo, Ta, Ti, or other conductive material. It is noted that metal layer 1744 within the composite opening 1740 may be equivalently described as the metal layer 1744 formed within each of the contact opening 1738, the gate via opening 1734, and the contact via opening 1736, where the contact opening 1738 overlaps each of the gate via opening 1734 and the contact via opening 1736, as described above. In some embodiments, the width of the metal layer 1744 across the length of the composite opening 1740 may be about 30-60 nm, and the height of the metal layer 1744 may be about 10-30 nm. After deposition of the metal layer 1744, and in an embodiment of block 1616, a chemical mechanical planarization (CMP) process may be performed to remove excess material and planarize the top surface of the device 1700. Thus, after deposition of the metal layer 1744, contact is made, through a metal gate via and a contact via, between a metal gate layer and an adjacent source, drain, and/or body region. As described above, and because of the improved (i.e., increased) process window provided by the embodiments disclosed herein, the device 1700 is more robust (e.g., as compared to at least some current devices).

Figure 24:
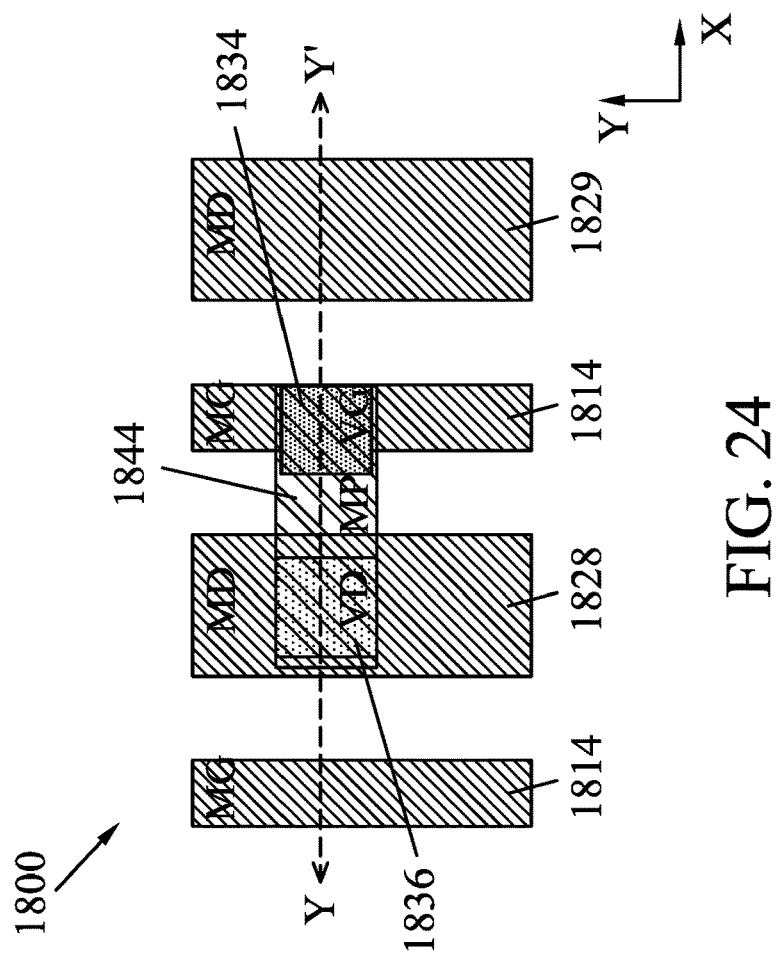
FIG. 24 provides a layout design illustrating various aspects of additional embodiments of the present disclosure.

With reference to FIG. 24, illustrated therein is a layout design 1800, which effectively provides a top schematic view of the device 1700, discussed above. In some embodiments, the cross-section views of the device 1700 shown in FIGS. 17-23 are provided along a plane substantially parallel to the line Y-Y', illustrated in FIG. 24. The layout design 1800 of FIG. 24 further illustrates metal gate layers 1814, which may be the metal gate layers 1714 described above; metal layers 1828 and 1829, which may be the metal layers 1728, 1729 described above; metal layer 1844, which may be the metal layer 1744 described above; gate via 1834, which may be the gate via formed in the gate via opening 1734 described above; and contact via 1836, which may be the contact via formed in the contact via opening 1736 described above. By way of example, and in some embodiments, the metal layer 1844 may have a length of about 30-60 nm along an X-axis, and a width of about 10-30 nm along a Y-axis. In some examples, the gate via 1834 may have a length of about 10-25 nm along the X-axis, and a width of about 10-25 nm along the Y-axis. In some examples, the contact via 1836 may have a length of about 10-25 nm along the X-axis, and a width of about 10-25 nm along the Y-axis. Additionally, in some embodiments, the metal gate layers 1814 may have a width of about 4-10 nm along the X-axis, and the metal layers 1828, 1829 may have a width of about 10-30 nm along the X-axis.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to a via-first metal gate contact fabrication process. In at least some embodiments, a via-first metal gate contact process is provided in which rather than directly contacting a metal gate to a metal contact layer, as in at least some conventional processes, a gate via is first formed on the metal gate, after which the metal contact layer is formed on the gate via. In various examples, the metal contact layer may further connect to an adjacent source, drain, and/or body region. In some embodiments, the gate via is centered on the metal gate and may provide a larger landing window for the metal contact layer (e.g., as compared to directly contacting the metal gate to the contact metal layer). As a result of adding the gate via between the metal gate and the metal contact layer, the process window is improved (e.g., increased). In addition, employing a gate via as described herein results in the metal contact layer (e.g., which contacts the gate via) to be disposed an increased distance 'Z' (e.g., as compared to at least some conventional processes), in a direction normal to the substrate, thus providing greater isolation between the metal contact layer and neighboring metal gates to which the metal contact layer is not connected. As such, leakage current between the metal contact layer and one or more neighboring metal gates, to which the metal contact layer is not connected, is reduced. Thus, the various embodiments disclosed herein provide for higher quality and more robust gate connections, which further provides for improved device and circuit performance.

Thus, one of the embodiments of the present disclosure described a method for fabricating a semiconductor device including depositing a first dielectric layer over a substrate. In some embodiments, the substrate includes a gate structure having a metal gate layer. In some examples, an opening is formed within the first dielectric layer to expose a portion of the substrate adjacent to the gate structure, and a first metal layer is deposited within the opening. In various embodiments, a second dielectric layer is deposited over the first dielectric layer and over the first metal layer. Thereafter, in some embodiments, the first dielectric layer and the second dielectric layer are etched to form a gate via opening, where the gate via opening exposes the metal gate layer of the gate structure. In some cases, a portion of the second dielectric layer is removed to form a contact opening that exposes the first metal layer, where the gate via opening and the contact opening merge to form a composite opening. In some embodiments, a second metal layer is deposited within the composite opening, where the second metal layer electrically connects, through a gate via portion of the second metal layer, the metal gate layer of the gate structure to the first metal layer.

In another of the embodiments, discussed is a method where a first metal layer that abuts a sidewall of a gate structure is formed. In some embodiments, the first metal layer contacts a region of a substrate below the first metal layer, and the gate structure includes a metal gate. In some examples, a first dielectric layer is deposited over the substrate. In some embodiments, and in a region over the gate structure, the first dielectric layer is etched to form a gate via opening, where the gate via opening exposes the metal gate of the gate structure. In various examples, and in a region over the first metal layer, the first dielectric layer is etched to form a contact via opening, where the contact via opening exposes the first metal layer. In some embodiments, and from a region between the gate via opening and the contact via opening, the first dielectric layer is removed to form a contact opening, where the contact opening, the gate via opening, and the contact via opening merge to form a composite opening. Thereafter, in some embodiments, a second metal layer is formed within the composite opening to electrically connect, through a gate via portion and a contact via portion of the second metal layer, the metal gate of the gate structure to the first metal layer.

In yet another of the embodiments, discussed is a semiconductor device including a substrate having a gate structure that includes a metal gate. In some examples, a first metal layer abuts a sidewall spacer disposed on a sidewall of the gate structure, where the first metal layer contacts a region of a substrate below the first metal layer. In some embodiments, a dielectric layer is disposed over the substrate, where the dielectric layer includes a composite opening filled with a second metal layer. In various cases, the second metal layer includes a gate via defined within a gate via portion of the composite opening, where the gate via contacts the metal gate, and where the gate via is substantially aligned with the metal gate. In some embodiments, the second metal layer contacts the first metal layer within a contact portion of the composite opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate including a gate structure having a metal gate, wherein a sidewall spacer is disposed on a sidewall of the gate structure;
    a first metal layer abutting the sidewall spacer, wherein the first metal layer contacts a substrate region adjacent to the gate structure, wherein a top surface of the first metal layer extends above a horizontal plane defined by a top surface of the sidewall spacer; and
    a dielectric layer over the substrate, wherein the dielectric layer includes a composite opening including a gate via portion and a contact portion at least partially overlapping the gate via portion, and wherein the composite opening is filled with a second metal layer;
    wherein the second metal layer includes a gate via defined within the gate via portion, and wherein the gate via contacts the metal gate; and
    wherein the second metal layer contacts the first metal layer within the contact portion.

2. The semiconductor device of claim 1, wherein the substrate region adjacent to the gate structure includes a source region, a drain region, or a body contact region.

3. The semiconductor device of claim 1, further comprising a silicide layer disposed on the substrate region adjacent to the gate structure, wherein the first metal layer contacts the silicide layer.

4. The semiconductor device of claim 1, wherein the dielectric layer includes an inter-layer dielectric layer.

5. The semiconductor device of claim 1, wherein the gate via is substantially aligned with the metal gate.

6. The semiconductor device of claim 2, wherein the second metal layer electrically connects the metal gate to the first metal layer, and wherein the first metal layer is electrically connected to the source region, the drain region, or the body contact region.

7. The semiconductor device of claim 1, further comprising a contact etch stop layer (CESL) disposed over the substrate and the dielectric layer over the CESL, wherein portions of each of the CESL and the dielectric are disposed on opposing sides of the composite opening.

8. The semiconductor device of claim 1, further comprising a dielectric region disposed beneath the contact portion of the composite opening, above the sidewall spacer, and between the gate via and the first metal layer.

9. A device, comprising:
    a gate structure including a metal gate;
    a first metal layer adjacent to the gate structure and in contact with a substrate region adjacent to the gate structure; and
    a dielectric layer over the gate structure and the first metal layer, wherein the dielectric layer includes a composite opening including one or more via portions and a contact portion at least partially overlapping the one or more via portions, and wherein the composite opening is filled with a second metal layer;
    wherein the second metal layer includes one or more vias, defined within the one or more via portions, that contact one or both of the metal gate of the gate structure and the first metal layer adjacent to the gate structure; and
    wherein a top surface of the first metal layer extends at least partially through the dielectric layer.

10. The device of claim 9, wherein the one or more vias includes a first via defined within a first via portion of the one or more via portions and a second via defined within a second via portion of the one or more via portions, wherein the first via is substantially aligned with the metal gate, and wherein the second via is substantially aligned with the first metal layer.

11. The device of claim 9, wherein the substrate region adjacent to the gate structure includes a source region, a drain region, or a body contact region.

12. The device of claim 11, wherein the second metal layer electrically connects the metal gate to the first metal layer, and wherein the first metal layer is electrically connected to the source region, the drain region, or the body contact region.

13. The device of claim 10, wherein a first bottom portion of the first via is separated from a second bottom portion of the second via by a first portion of a contact etch stop layer (CESL) along a first side of each the first and second vias.

14. The device of claim 13, wherein each of the first via and the second via are in contact with both the dielectric layer and second portions of the CESL along a second side of each of the first and second vias.

15. A semiconductor device, comprising:
a first gate structure having a first metal gate and a first sidewall spacer disposed on a sidewall of the first gate structure, and a second gate structure having a second metal gate and a second sidewall spacer disposed on a sidewall of the second gate structure, wherein top surfaces of the first metal gate, the first sidewall spacer, the second metal gate, and the second sidewall spacer are level and define a first horizontal plane;
a first metal layer interposing the first and second gate structures, wherein the first metal layer contacts a substrate region between the first and second gate structures, and wherein a first top surface of the first metal layer extends above the first horizontal plane by a first distance; and
a second metal layer including both a gate via portion that contacts the top surface of the second metal gate of the second gate structure and a contact portion that contacts the first top surface of the first metal layer along a bottom surface of the contact portion;
wherein the bottom surface of the contact portion of the second metal layer is spaced from the first metal gate of the first gate structure by a second distance, wherein the second distance is greater than the first distance.

16. The semiconductor device of claim 15, wherein the bottom surface of the contact portion is level with a second top surface of a third metal layer, wherein the third metal layer interposes the second gate structure and a third gate structure, and wherein the third metal layer contacts a different substrate region between the second and third gate structures.

17. The semiconductor device of claim 15, wherein the contact portion at least partially overlaps the gate via portion.

18. The semiconductor device of claim 15, wherein the gate via portion is substantially aligned with the second metal gate of the second gate structure.

19. The semiconductor device of claim 1, further comprising a glue or barrier layer disposed adjacent to, and in contact with, at least one of the first metal layer and the second metal layer.

20. The semiconductor device of claim 15, further comprising a contact etch stop layer (CESL), wherein portions of the CESL are disposed on opposing sides of the second metal layer.

* * * * *